United States Patent [19]
Aisou et al.

[11] Patent Number: 5,926,709
[45] Date of Patent: Jul. 20, 1999

[54] PROCESS OF FABRICATING MINIATURE MEMORY CELL HAVING STORAGE CAPACITOR WITH WIDE SURFACE AREA

[75] Inventors: Fumiki Aisou; Toshiyuki Hirota, both of Tokyo, Japan

[73] Assignee: NEC Corporation, Tokyo, Japan

[21] Appl. No.: 08/621,954

[22] Filed: Mar. 26, 1996

[30] Foreign Application Priority Data

Mar. 30, 1995 [JP] Japan ................................. 7-072802

[51] Int. Cl.$^6$ .............................................. H01L 21/8242
[52] U.S. Cl. ......................... 438/253; 438/396; 438/239; 438/381
[58] Field of Search ............................... 438/253, 396, 438/239, 381

[56] References Cited

U.S. PATENT DOCUMENTS

| | | | |
|---|---|---|---|
| 5,223,448 | 6/1993 | Su | 438/253 |
| 5,292,677 | 3/1994 | Dennison | 438/396 |
| 5,335,138 | 8/1994 | Sandhu et al. | 438/253 |
| 5,451,539 | 9/1995 | Ryou | 438/396 |
| 5,478,768 | 12/1995 | Iwasa | 438/253 |
| 5,492,850 | 2/1996 | Ryou | 438/253 |
| 5,627,095 | 5/1997 | Koh et al. | 438/396 |
| 5,661,065 | 8/1997 | Koga | 438/253 |
| 5,696,015 | 12/1997 | Hwang | 438/396 |
| 5,741,722 | 4/1998 | Lee | 438/253 |
| 5,792,687 | 8/1998 | Jeng et al. | 438/253 |

FOREIGN PATENT DOCUMENTS

| | | |
|---|---|---|
| 3-69162 | 3/1991 | Japan . |
| 4-158515 | 6/1992 | Japan . |

*Primary Examiner*—John F. Niebling
*Assistant Examiner*—Lynne A. Gurley
*Attorney, Agent, or Firm*—J. Warren Whitesel Laff, Whitesel & Saret, Ltd.

[57] ABSTRACT

A node contact hole is formed in an inter-level insulating layer through an anisotropic etching using an inner conductive side wall formed in a primary opening as an etching mask, and an outer conductive side wall concurrently formed from a doped polysilicon together with a conductive plug in the node contact hole increases the surface area of a storage node electrode of a stacked storage capacitor.

9 Claims, 19 Drawing Sheets

PROCESS OF FABRICATING MINIATURE MEMORY CELL HAVING STORAGE CAPACITOR WITH WIDE SURFACE AREA

FIELD OF THE INVENTION

This invention relates to a process of fabricating a miniature dynamic random access memory cell and, more particularly, to a process of fabricating a miniature dynamic random access memory cell having a storage capacitor with a wide surface area.

DESCRIPTION OF THE RELATED ART

A memory cell array of a semiconductor dynamic random access memory device occupies a half of the real estate of a semiconductor chip, and it is necessary to scale down each memory cell for increasing the integration density of the semiconductor dynamic random access memory device. The semiconductor dynamic random access memory device stores data bits in the memory cells in the form of electric charge, and the data bits are periodically refreshed so as to maintain the amount of electric charge in each dynamic random access memory cell. If the amount of electric charge stored in a dynamic random access memory cell is decreased below a critical level, the semiconductor dynamic random access memory device loses the data bit. Therefore, the dynamic random access memory cell is expected to accumulate the electric charge much enough to maintain the data bit over the refreshing cycle.

A typical example of the dynamic random access memory cell is implemented by a series of a switching transistor and a storage capacitor, and is three-dimensionally fabricated on a semiconductor chip. A stacked storage capacitor is a typical example of the three-dimensional structure. The stacked storage capacitor is placed over the switching transistor, and includes a storage node electrode, a dielectric film structure and a counter electrode shared with other stacked storage capacitors.

In order to increase the capacitance of the stacked storage capacitor without sacrifice of the occupation area, the manufacturer needs to increase the surface area of the storage node electrode and to miniaturize a node contact hole for electrically connecting the storage node electrode to the source region of the switching transistor. Even if the surface area is increased and the node contact hole is miniaturized through a complicated process sequence, the complicated process sequence decreases the production yield, and increases the production cost. Therefore, a simple process is necessary.

A prior art process for forming a miniature node contact hole is disclosed in Japanese Patent Publication of Unexamined Application No. 4-158515, and Japanese Patent Publication of Unexamined Application No. 3-69162 discloses a prior art process of increasing the surface area of a storage node electrode.

FIGS. 1A to 1F illustrates the prior art process for forming a miniature contact hole disclosed in Japanese Patent Publication of Unexamined Application No. 4-158515.

The prior art process starts with preparation of a semiconductor substrate 1, and a polysilicon word line 2 extending on the semiconductor substrate 1. Boro-phosphosilicate glass is deposited to 0.5 micron thick over the polysilicon word line 2 by using a chemical vapor deposition, and is reflowed in wet atmosphere at 850 degrees in centigrade for 10 minutes. As a result, the polysilicon word line 2 is overlain by a boro-phosphosilicate glass layer 3.

Subsequently. polysilicon is deposited to 1000 angstroms thick over the boro-phosphosilicate glass layer 3 by using a chemical vapor deposition, and the polysilicon layer 4 is coated with a photo-resist layer. The photo-resist layer is patterned into an etching mask 5 by using lithographic techniques, and the polysilicon layer 4 is selectively etched away in an etchant of $CCl_4/O_2$ by using a reactive ion etching technique. As a result, a first opening 6 is formed in the polysilicon layer 4 as shown in FIG. 1A, and is 0.5 micron in diameter.

Polysilicon is deposited to 1500 angstroms thick by using the chemical vapor deposition, and a polysilicon layer 7 topographically extends over the polysilicon layer 4 and the exposed surface of the silicon oxide layer 3 as shown in FIG. 1B.

The polysilicon layer 7 is anisotropically etched in $CCl_4/O_2$ by using the reactive ion etching, and a side wall 8 of polysilicon is formed along the inner surface of the polysilicon layer 4 as shown in FIG. 1C. The side wall 8 defines a second opening 9 in the first opening, and the second opening is about 0.2 micron in diameter.

Using the polysilicon layer 4 and the side wall 8 as an etching mask, the boro-phosphosilicate glass layer 3 is selectively etched in $CHF_3/He$ by using a reactive ion etching, and the reactive ion etching forms a miniature contact hole 10 in the boro-phosphosilicate glass layer 3. The miniature contact hole 10 reaches the polysilicon word line 2 as shown in FIG. 1D.

A photo-resist layer (not shown) is formed on the entire surface of the structure, and swells out over the upper surface of the boro-phosphosilicate glass layer 3. The photo-resist layer is exposed to an optical radiation, and is, thereafter, developed. The photo-resist film 11 on the polysilicon word line 2 is not affected by the optical radiation, and the developing solution can not dissolve the photo-resist film 11. As a result, the polysilicon word line 2 exposed to the contact hole 10 is covered with the photo-resist film 11 as shown in FIG. 1E.

Using the photo-resist film 11 as a protective mask, the polysilicon layer 4 and the polysilicon side wall 8 are etched in $CF_4/O_2$ by using a reactive ion etching. The photo-resist film 11 is removed by using $O_2$ plasma, and the polysilicon word line 2 is exposed to the contact hole 10 again.

Aluminum or aluminum alloy is deposited over the entire surface of the resultant structure by using a sputtering, and the aluminum layer or the aluminum alloy layer is patterned to a metal wiring 12 as shown in FIG. 1F.

The prior art process is applied to the miniature contact hole between the polysilicon word line 2 and the metal wiring 12.

FIGS. 2A to 2C illustrates the prior art process for increasing the surface area of a storage node electrode. The prior art process sequence starts with preparation of a silicon substrate 21, and a field oxide layer 22 is selectively grown on the major surface of the silicon substrate 21. A gate oxide layer 23 is formed on the exposed surface of the silicon substrate 21, and polysilicon is deposited over the field oxide layer 22 and the gate oxide layer 23. Though not shown in the figures, a photo-resist mask is formed on the polysilicon layer, and the polysilicon layer is patterned into polysilicon gate electrodes 24.

The photo-resist mask is stripped off, and n-type dopant impurity is ion implanted into the silicon substrate 21, and an n-type source region (not shown) and an n-type drain region (not shown) are formed in the silicon substrate 21 in a self-aligned manner with the polysilicon gate electrodes 24.

An inter-level insulating layer 25 is deposited over the polysilicon gate electrodes 24, and a contact hole 25a is formed in the inter-level insulating layer 25. Polysilicon is deposited over the entire upper surface of the inter-level insulating layer 25, and swells out from the contact hole 25a. A photo-resist mask is formed on the polysilicon layer, and the polysilicon layer is patterned to a heavily doped n-type stacked polysilicon strip 26 by using a reactive ion etching. The heavily doped n-type stacked polysilicon strip 26 has a side surface 26a substantially vertical to the upper surface of the inter-level insulating layer 25.

Polysilicon is deposited to 2000 angstroms thick, and the heavily doped n-type stacked polysilicon strip 26 is covered with the polysilicon layer 27 as shown in FIG. 2A.

The polysilicon layer 27 is etched in CCl$_4$ gas by using a reactive ion etching without a mask. As a result, a side wall 27a is formed on the side surface 26a of the heavily doped n-type stacked polysilicon strip 26 as shown in FIG. 2B.

The memory cell occupies an area of 3.5×1.8 square-micron. The polysilicon side wall 27a of 2000 angstroms thick widens the effective area of the stacked polysilicon electrode 28, and the effective area of the stacked polysilicon electrode 28 is increased to 24×1.2 square-micron.

A dielectric film is deposited over the stacked polysilicon electrode 28, and the dielectric film is covered with a conductive layer. Using a mask formed on the conductive layer, the conductive layer is patterned into a counter electrode 29, and the dielectric film is patterned to a dielectric layer 30 by using the counter electrode 29 as a mask. The resultant structure is illustrated in FIG. 2C.

The prior art process is applied to the stacked type storage capacitor.

PRIMITIVE PROCESS OBTAINED DURING DEVELOPMENT EFFORT

The present inventors have made development efforts for a miniature dynamic random access memory cell with an emphasis put on a miniature contact hole and a storage node electrode having wide surface area. The present inventors firstly modified the prior art process for forming a miniature contact hole, and applied to a process of forming a node contact hole for the storage node electrode. The modified process is combined with the prior art process for increasing the surface area of a storage node electrode. The combined process is hereinbelow described with reference to FIGS. 3A to 3G on the assumption that a dynamic random access memory cell is designed under 0.4-micron design rules. Word "non-doped" means that the dopant concentration is ignoreable, and "non-doped" semiconductor material does not mean an intrinsic semiconductor material.

The combined process sequence starts with preparation of a p-type silicon substrate 41, and a field oxide layer 42 is selectively grown on the major surface of the p-type silicon substrate 41. The field oxide layer 42 defines an active area assigned to a pair of dynamic random access memory cells, however, description is focused on one of the dynamic random access memory cells.

The active area is thermally oxidized for growing a gate oxide layer 43a, and a gate electrode 43b is patterned on the gate oxide layer 43a from a polysilicon layer. The gate electrode 43b forms a part of a word line, and other word lines WL extend over the field oxide layer 42.

N-type dopant impurity is ion implanted into the active area, and an n-type source region 43c and an n-type drain region 43d are formed in the active area in a self-aligned manner with the gate electrode 43b. The gate oxide layer 43a, the gate electrode 43b, the n-type source region 43c and the n-type drain region 43d as a whole constitute an n-channel enhancement type witching transistor 43.

An inter-level insulating layer 44 of silicon oxide is deposited to 1 micron thick over the entire surface of the structure, and the n-channel enhancement type switching transistor 43, the other word lines WL and the field oxide layer 42 are covered with the inter-level insulating layer 44.

Subsequently, non-doped polysilicon is deposited to 0.5 micron thick over the entire surface of the inter-level insulating layer 44 by using a low-pressure chemical vapor deposition. N-type dopant impurity is ion implanted into the non-doped polysilicon layer, and the non-doped polysilicon layer is converted to an n-type single crystal silicon layer 45 through a heat treatment. The non-doped polysilicon layer may be converted to the n-type single crystal silicon layer 45 by using a thermal diffusion.

Silicon oxide is deposited to 0.15 micron thick on the n-type single crystal silicon layer 45 by using an atmospheric pressure chemical vapor deposition, and the n-type single crystal silicon layer 45 is overlain by a silicon oxide layer 46. A photo-resist mask (not shown) is patterned on the silicon oxide layer 46, and exposes a part of the silicon oxide layer 46 over the n-type source region 43c. The exposed area of the silicon oxide layer 46 is etched away so as to form an opening 6a of 0.4 micron square. The photo-resist mask is stripped off, and resultant structure is illustrated in FIG. 1A.

Using the patterned silicon oxide layer 46 as a mask, the n-type single crystal silicon layer 45 is selectively etched away, and an opening 45a is formed in the n-type single crystal silicon layer 45. The opening 45a is aligned with the opening 46a, and the openings 45a and 46a form in combination a primary hole 47.

N-type doped polysilicon is deposited to 0.15 micron thick over the upper surface of the patterned silicon oxide layer 46 and the exposed surfaces defining the primary hole 47 through a low-pressure chemical vapor deposition using gaseous mixture of silane (SiH$_4$) and phosphine (PH$_3$). The n-type doped polysilicon layer is etched back without a mask, and a side wall 48 is formed on the inner side surface of the n-type single crystal silicon layer 45 as shown in FIG. 3B. The side wall 48 defines a secondary hole 49 narrower than the primary hole 47, and a part of the inter-level insulating layer 44 is exposed to the secondary hole 49.

The reason why the side wall 48 is formed from the n-type doped polysilicon layer is that n-type doped polysilicon is lower in growing speed than non-doped polysilicon. The n-type doped polysilicon layer is easily controlled in the combined process.

Subsequently, an anisotropic etching is carried out by using the side wall 48 and the n-type single crystal silicon layer 45 as an etching mask. The anisotropic etching forms a node contact hole 50 of 0.25 micron square in the inter-level insulating layer 44 as shown in FIG. 50. The silicon oxide layer 46 is also etched away during the anisotropic etching.

N-type doped polysilicon is deposited to 0.4 micron thick over the entire surface by using the low-pressure chemical vapor deposition, and the n-type single crystal silicon layer 45 is covered with an n-type doped polysilicon layer 51. The n-type doped polysilicon layer 51 penetrates through the node contact hole, and is held in contact with the n-type source region 43c as shown in FIG. 3D.

The n-type doped polysilicon can form good step coverage, and the n-type doped polysilicon layer 51 densely fills the secondary hole 49 and the node contact hole 50. Another reason why the inventors use the n-type doped polysilicon is that n-type dopant impurity is hardly introduced into non-doped polysilicon after the deposition.

Subsequently, the n-type doped polysilicon layer 51 is covered with a photo-resist layer, and the photo-resist layer is patterned to a photo-resist etching mask 52 covering a part of the n-type doped polysilicon layer 51 over the n-type source region 43c. The photo-resist etching mask 52 has mask portions 52a and 52b spaced from each other by 0.4 micron.

Using the photo-resist etching mask 52, the n-type doped polysilicon layer 51 and the single crystal silicon layer 45 are anisotropically etched away, and an n-type single crystal silicon pattern 45a and an n-type doped polysilicon pattern 51a are left beneath the photo-resist etching mask 52a as shown in FIG. 3E.

The photo-resist etching mask 52 is stripped off, and n-type doped polysilicon is deposited to 0.15 micron thick over the entire surface of the resultant structure by using the low-pressure chemical vapor deposition again. As a result, an n-type doped polysilicon layer (not shown) topographically extends over the side surface of the n-type single crystal silicon pattern 45a, the side and upper surfaces of the n-type doped polysilicon pattern 51a and an exposed upper area of the inter-level insulating layer 44.

The n-type doped polysilicon layer is etched without an etching mask, and side walls 53a and 53b are formed on the side surfaces of the n-type single crystal silicon/n-type doped polysilicon patterns 45a/51a as shown in FIG. 3F. The side wall 48, the n-type single crystal silicon pattern 45a, the n-type doped polysilicon pattern 51a and the side wall 53a/53b form in combination a storage node electrode 54a, and the storage node electrode 54a is spaced from the adjacent storage node electrode by 0.25 micron which is less than the minimum line width of 0.4 micron. The side wall 53a increases the surface area of the storage node electrode 54a.

Silicon nitride is deposited to 6 nanometers thick over the entire surface of the resultant structure by using a low-pressure chemical vapor deposition, and a silicon nitride layer covers the storage node electrodes 54a. The silicon nitride layer 54b serves as a dielectric film 54b. A conductive material is deposited over the dielectric film 54b, and is patterned to a counter electrode 54c by using the lithographic techniques. The storage node electrode 54a, the dielectric film 54b and the counter electrode 54c as a whole constitute a stacked storage capacitor 54. The resultant structure is illustrated in FIG. 3G.

The combined process is modifiable so as to fabricate a dynamic random access memory cell having a cylindrical storage node electrode as shown in FIGS. 4A to 4H. The manufacturer is assumed to design a dynamic random access memory cell under the 0.4 micron design rules.

The process sequence starts with preparation of a p-type silicon substrate 61. An n-channel enhancement type switching transistor 62 with an n-type source region 62a is fabricated on the p-type silicon substrate 61 as similar to the combined process, and an inter-level insulating layer 63 of silicon oxide covers the n-channel enhancement type switching transistor 62 and a field oxide layer 64 selectively grown on the p-type silicon substrate 61. The inter-level insulating layer 63 is 1 micron thick as similar to the inter-level insulating layer 44.

Subsequently, silicon nitride is deposited to 0.2 micron thick by using the low-pressure chemical vapor deposition over the entire surface of the resultant structure, and the upper surface of the inter-level insulating layer 63 is covered with a silicon nitride layer 65. Non-doped polysilicon is deposited to 0.2 micron thick over the silicon nitride layer 65 by using the low-pressure chemical vapor deposition, and the silicon nitride layer 65 is overlain by a non-doped polysilicon layer. N-type dopant impurity is introduced into the non-doped polysilicon layer, and covers the non-doped polysilicon layer to an n-type doped polysilicon layer 66. Silicon oxide is deposited to 0.15 micron over the entire surface of the n-type doped polysilicon 66 by using the atmospheric-pressure chemical vapor deposition, and a silicon oxide layer 67 covers the n-type doped polysilicon layer 66.

A photo-resist etching mask (not shown) is patterned on the silicon oxide layer 67, and exposes an area over the n-type source region 62a. Using the photo-resist etching mask, the silicon oxide layer 67 and the n-type doped polysilicon layer 66 are selectively etched away, and a primary hole 68 is formed in the silicon oxide layer 67 and the n-type doped polysilicon layer 66. The primary hole 68 is 0.4 micron square, and the area of the silicon nitride layer is expose to the primary hole 68.

N-type doped polysilicon is deposited to 0.15 micron thick over the entire surface of the structure, and an n-type doped polysilicon layer extends over the upper and inner surfaces of the silicon oxide layer 67, the inner surface of the n-type doped polysilicon layer 66 and a part of the upper surface of the silicon nitride layer 65 exposed to the primary hole 68. The n-type doped polysilicon layer is etched without a mask, and a side wall 69 is formed on the inner surface of the n-type doped polysilicon layer 66 as shown in FIG. 4A. The side wall 69 defines a secondary hole 70 narrower than the primary hole 68.

Using the n-type doped polysilicon layer 66 and the side spacer 69 as an etching mask, the silicon nitride layer 65 and the inter-level insulating layer 63 are selectively and anisotropically etched in gaseous mixture of tetrafluoromethane ($CF_4$) and trifluoromethane ($CHF_3$). A node contact hole 71 is formed through the silicon nitride layer 65 and the inter-level insulating layer 63 as shown in FIG. 4B, and is 0.25 micron square. The silicon nitride layer 67 is etched away during the anisotropic etching.

N-type doped polysilicon is deposited to 0.4 micron thick over the entire surface of the structure by using the low-pressure chemical vapor deposition. As a result, an n-type doped polysilicon layer 72 extends over the upper surface of the n-type doped polysilicon layer 66, and fills the node contact hole 71 as shown in FIG. 4C.

Subsequently, phosphosilicate glass is deposited to 0.6 micron thick over the n-type doped polysilicon layer 72 by using an atmospheric-pressure chemical vapor deposition, and the n-type doped polysilicon layer 72 is overlain by a phosphosilicate glass layer 73 as shown in FIG. 4D.

The phosphosilicate glass layer 73 is coated with a photo-resist layer, and the photo-resist layer is patterned into a photo-resist etching mask 74. The photo-resist etching mask 74 has mask portions 74a/74b over the node contact holes 71, and the mask portion 74a is spaced from the adjacent mask portion 74b by 0.4 micron. Using the photo-resist etching mask 74, the n-type doped polysilicon layers 66 and 72a and the phosphosilicate glass layer 73 are anisotropically etched, and are patterned into n-type doped polysilicon strips 66a/72a and a phosphosilicate glass strip 73a as shown in FIG. 4E.

The photo-resist etching mask 74 is stripped off, and n-type doped polysilicon is deposited to 0.15 micron thick over the entire surface of the resultant structure by using the low-pressure chemical vapor deposition, and an n-type doped polysilicon layer extends over the upper and side surfaces of the phosphosilicate glass strip 73a, the side surfaces of the n-type doped polysilicon strips 72a/66a and the silicon nitride layer 65. The n-type doped polysilicon layer is etched without a mask, and is formed into a cylindrical side wall 74 as shown in FIG. 4F. The cylindrical side wall 74 is spaced from the adjacent cylindrical side wall by 0.25 micron.

Subsequently, the phosphosilicate glass strip 73a is exposed to gaseous mixture of hydrogen fluoride (HF) and water vapor, and is removed from the structure as shown in FIG. 4G. The side wall 69, the n-type doped polysilicon strips 66a/72a and the cylindrical side wall 74 as a whole constitute a cylindrical storage node electrode 75a. The cylindrical storage node electrode 75a is spaced from the adjacent cylindrical storage node electrode by 0.25 micron.

Silicon nitride is deposited to 6 nanometers thick over the entire surface of the resultant structure by using the low-pressure chemical vapor deposition, and a dielectric film 75b of the silicon nitride covers the cylindrical storage node electrodes 75a. A conductive material is deposited over the dielectric film 75b, and a conductive layer is patterned into a counter electrode 75c by using the lithographic techniques. The cylindrical storage node electrode 75a, the dielectric film 75b and the counter electrode 75c as a whole constitute a storage capacitor 75, and the resultant structure is illustrated in FIG. 4H.

Thus, the combined process miniaturizes the node contact hole 50/71, and increases the storage node electrode 54a/75a. The n-type doped polysilicon is grown three times in the combined process. As described hereinbefore, although the growth of the n-type doped polysilicon is slow, the manufacturer to exactly control the thickness of the n-type polysilicon layer, and eliminates a difficult dopant introduction into the polysilicon in the deep node contact hole 50/71. However, the growing steps complicate the combined process, and increases the production cost of the dynamic random access memory device.

SUMMARY OF THE INVENTION

It is therefore an important object of the present invention to provide a process of fabricating a dynamic random access memory cell which is simpler than the combined process.

To accomplish the object, the present invention proposes to concurrently form an outer side wall and a plug from a doped polysilicon layer.

In accordance with the present invention, there is provided a process of fabricating a dynamic random access memory device, comprising the steps of: a) preparing a first semiconductor layer; b) fabricating a switching transistor having an impurity region on the first semiconductor layer; c) covering the switching transistor and the first semiconductor layer with an inter-level insulating structure; d) forming a multi-level structure including a second semiconductor layer on the inter-level insulating structure; e) forming a primary opening in the multi-level structure over the impurity region; f) forming an inner conductive side wall held in contact with the second semiconductor layer on an inner surface of the multi-level structure defining the primary opening, the inner conductive side wall defining a secondary opening narrower than the primary opening; g) selectively etching the inter-level structure so as to form a node contact hole beneath the secondary opening, the impurity region being exposed to the node contact hole; h) forming a first etching mask having a lug portion filling the node contact hole on the multi-level structure; i) selectively etching the multi-level structure so as to form a patterned structure including a semiconductor strip formed from the second semiconductor layer; j) removing the first etching mask so as to expose the impurity region again; k) topographically depositing a third semiconductor layer on the entire surface of the resultant structure of the step j) so as to fill the node contact hole and cover the inner conductive side wall and an upper surface and an outer side surface of the patterned structure; l) uniformly etching the third semiconductor layer so as to form an outer conductive side wall held in contact with an outer side surface of the semiconductor strip and a conductive plug held in contact with the inner conductive side wall and the impurity region, the outer conductive side wall, the semiconductor strip, the inner conductive side wall and the conductive plug forming in combination a storage node electrode electrically connected to the witching transistor; m) covering the storage node electrode with a dielectric layer; and n) forming a counter electrode opposed through the dielectric layer to the storage node electrode.

BRIEF DESCRIPTION OF THE DRAWINGS

The features and advantages of the process of fabricating a dynamic random access memory cell according to the present invention will be more clearly understood from the following description taken in conjunction with the accompanying drawings in which.

DESCRIPTION OF THE PREFERRED EMBODIMENTS

First Embodiment

Figure 1A:
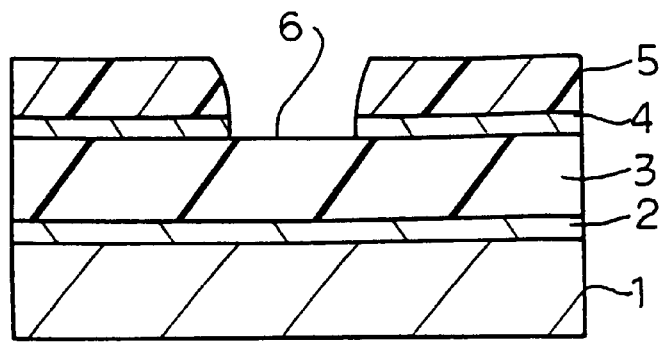
FIGS. 1A to 1F are cross sectional views showing the prior art process for forming the miniature contact hole.
Figure 1B:
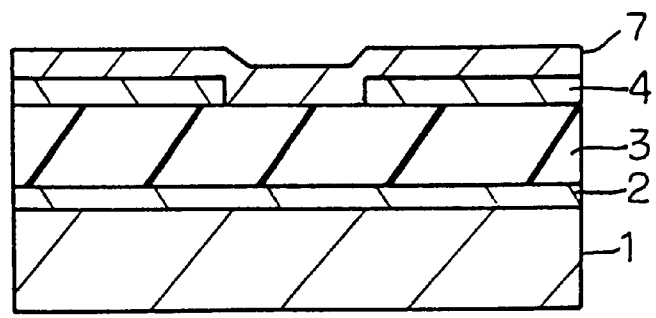
Figure 1C:
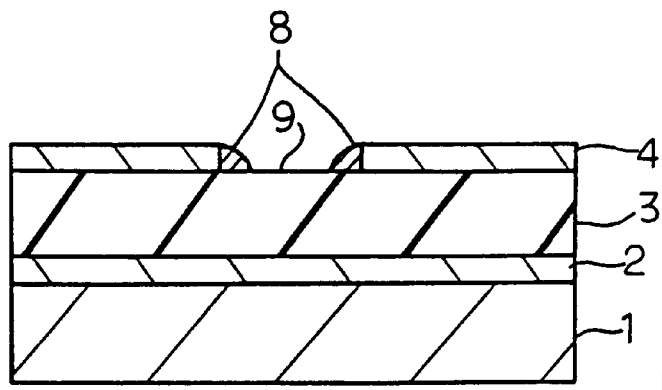
Figure 1D:
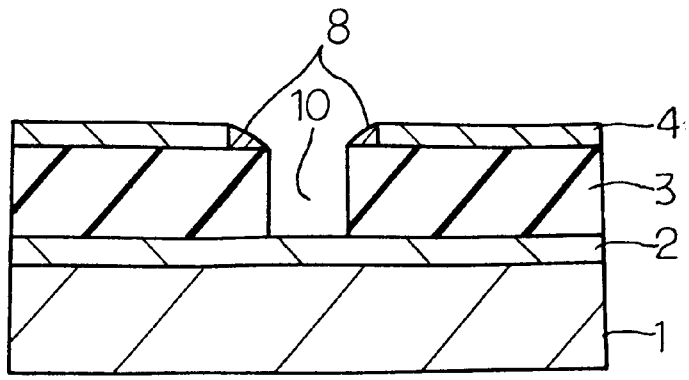
Figure 1E:
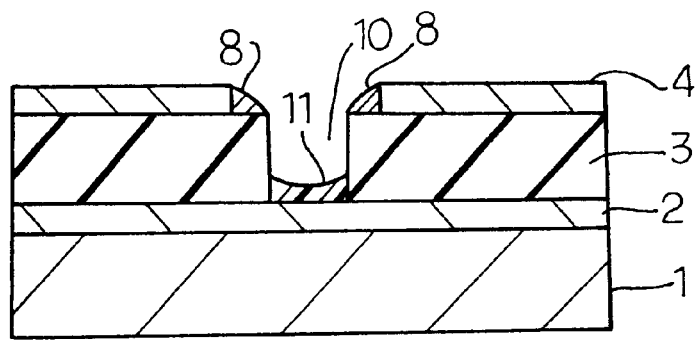
Figure 1F:
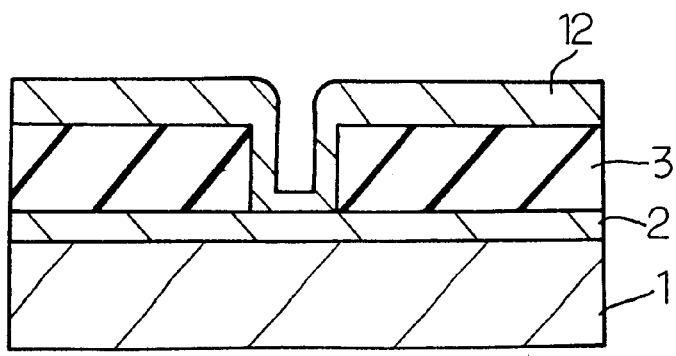
Figure 2A:
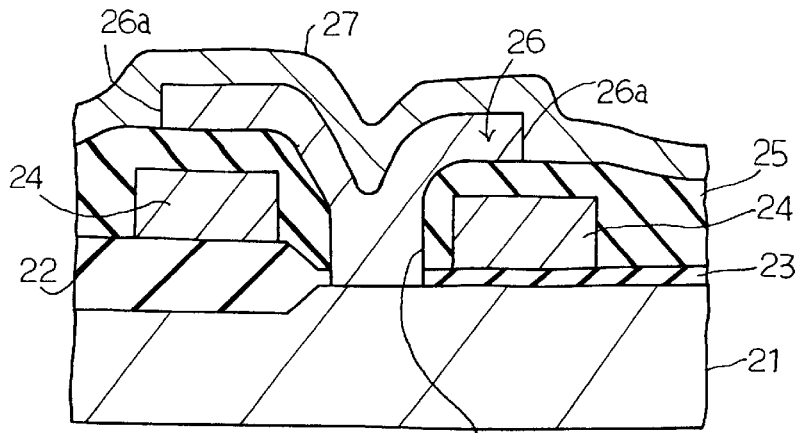
FIGS. 2A to 2C are cross sectional views showing the prior art process for increasing the surface area of the storage node electrode.
Figure 2B:
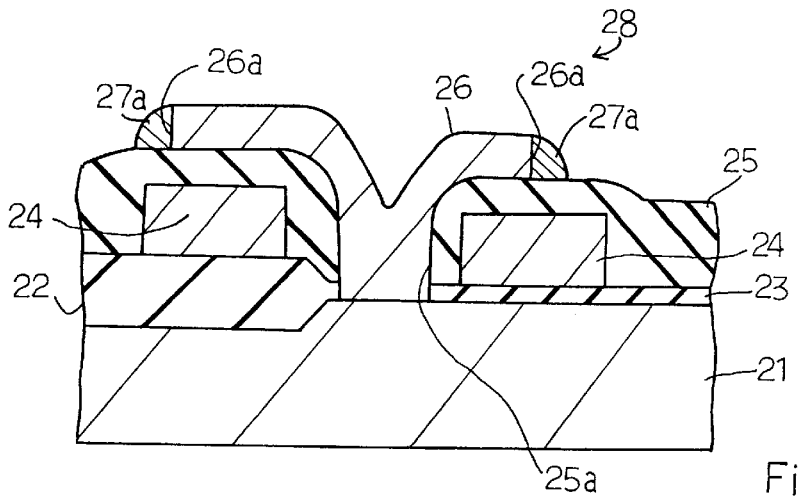
Figure 2C:
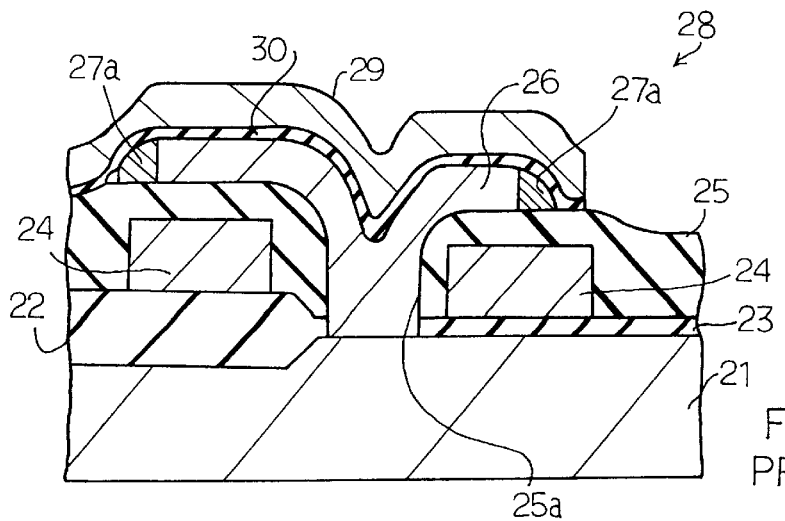
Figure 3A:
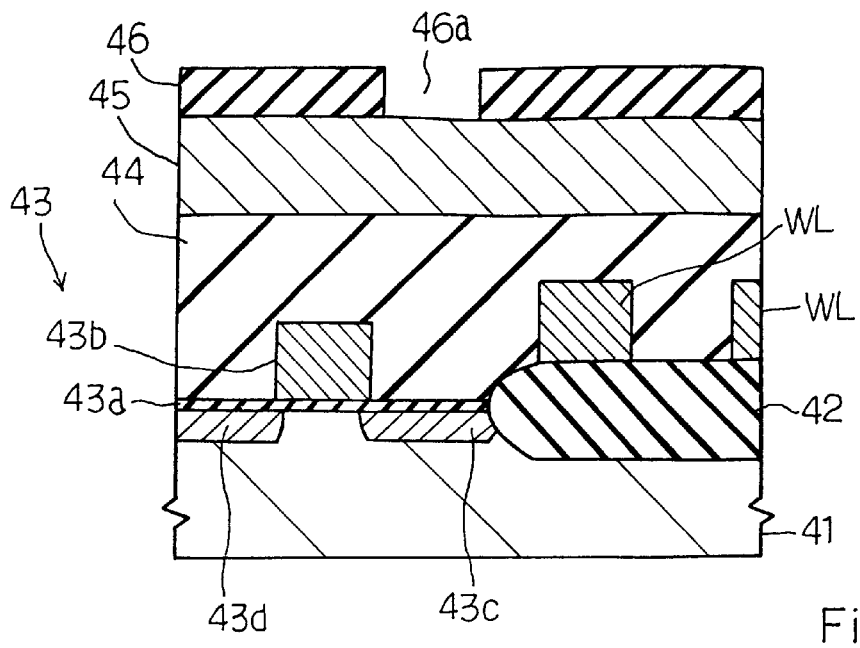
FIGS. 3A to 3G are cross sectional views showing the process sequence for fabricating a dynamic random access memory cell obtained during the development efforts of the inventors.
Figure 3B:
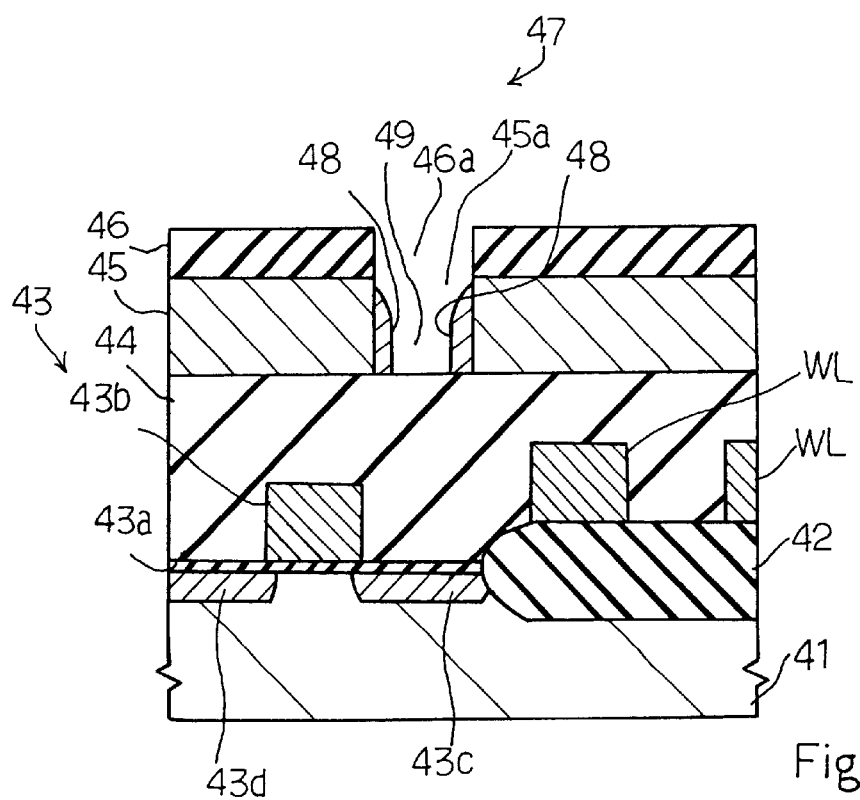
Figure 3C:
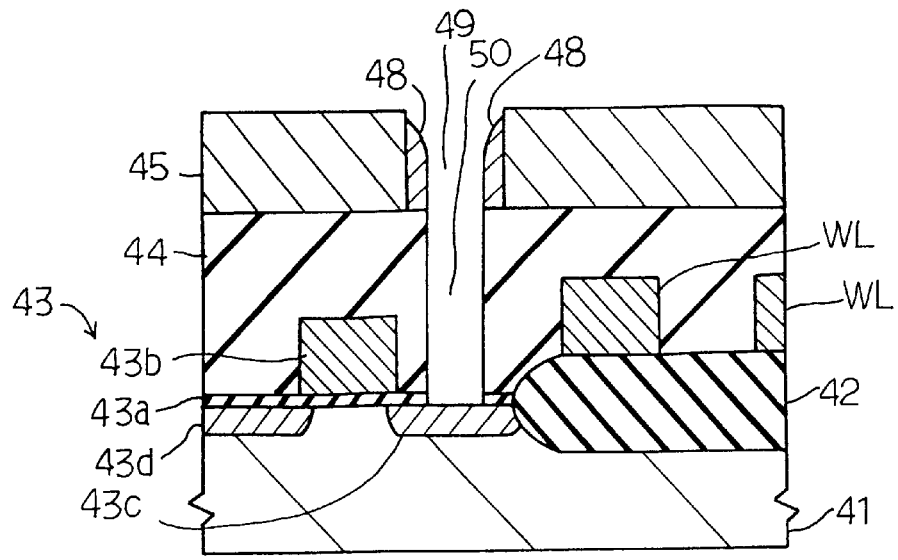
Figure 3D:
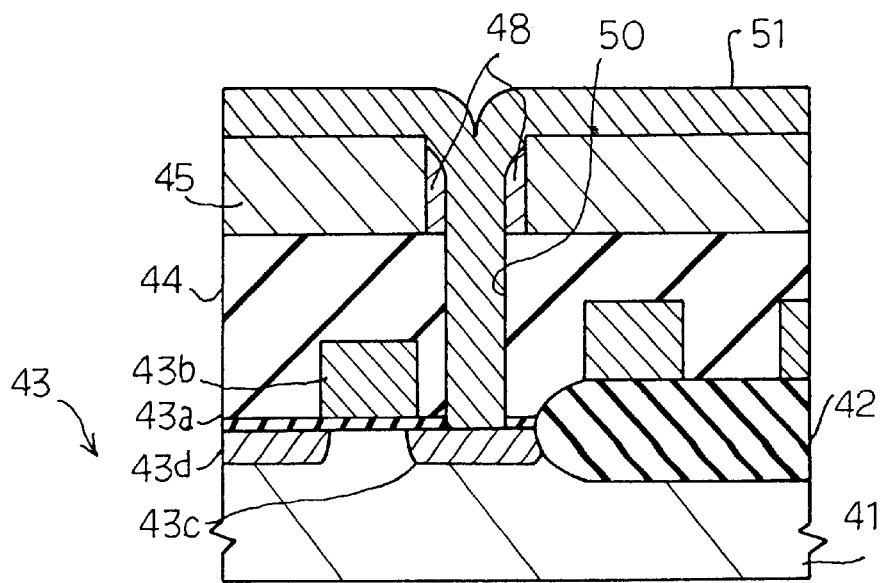
Figure 3E:
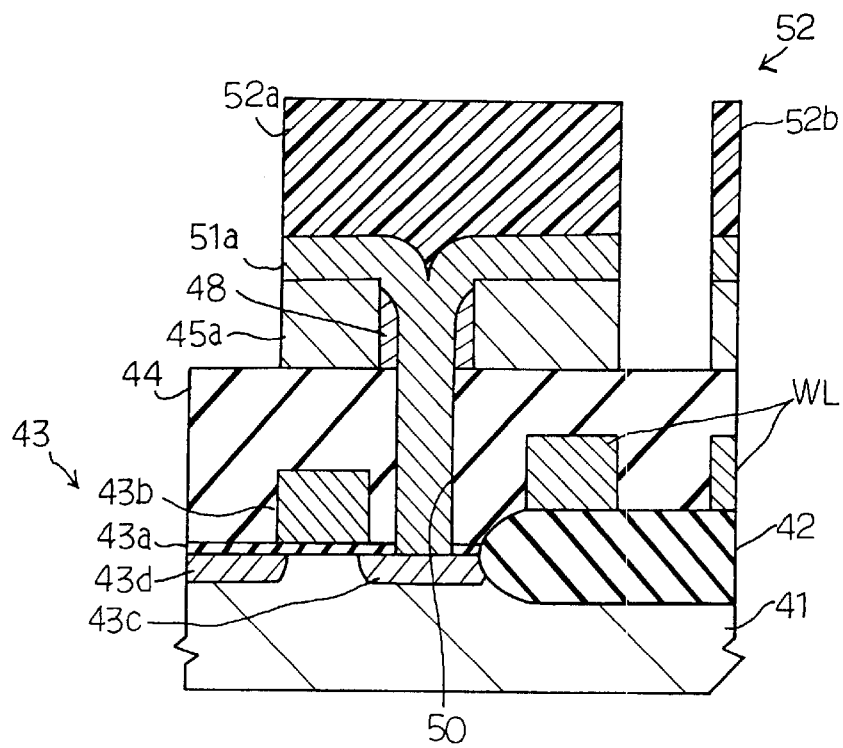
Figure 3F:
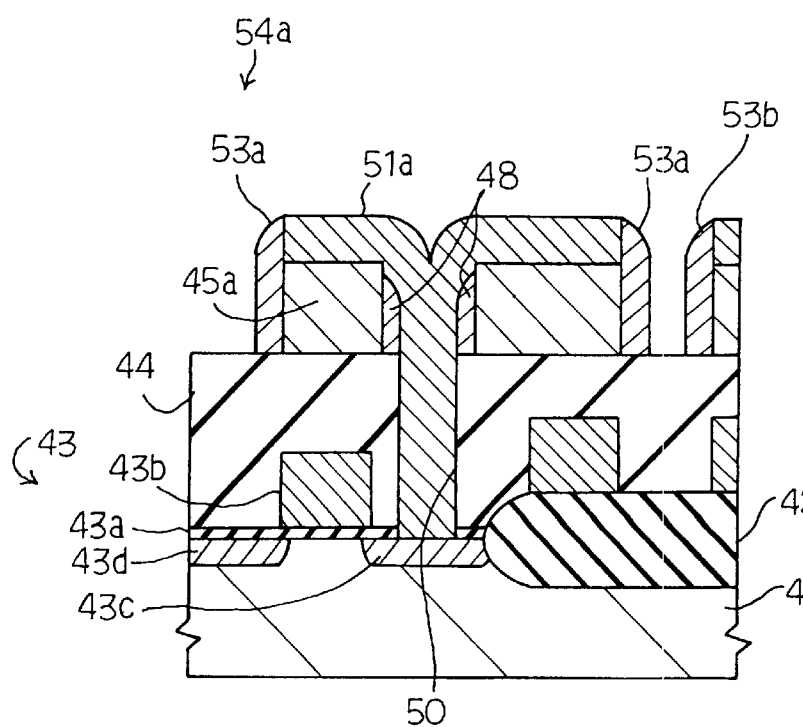
Figure 3G:
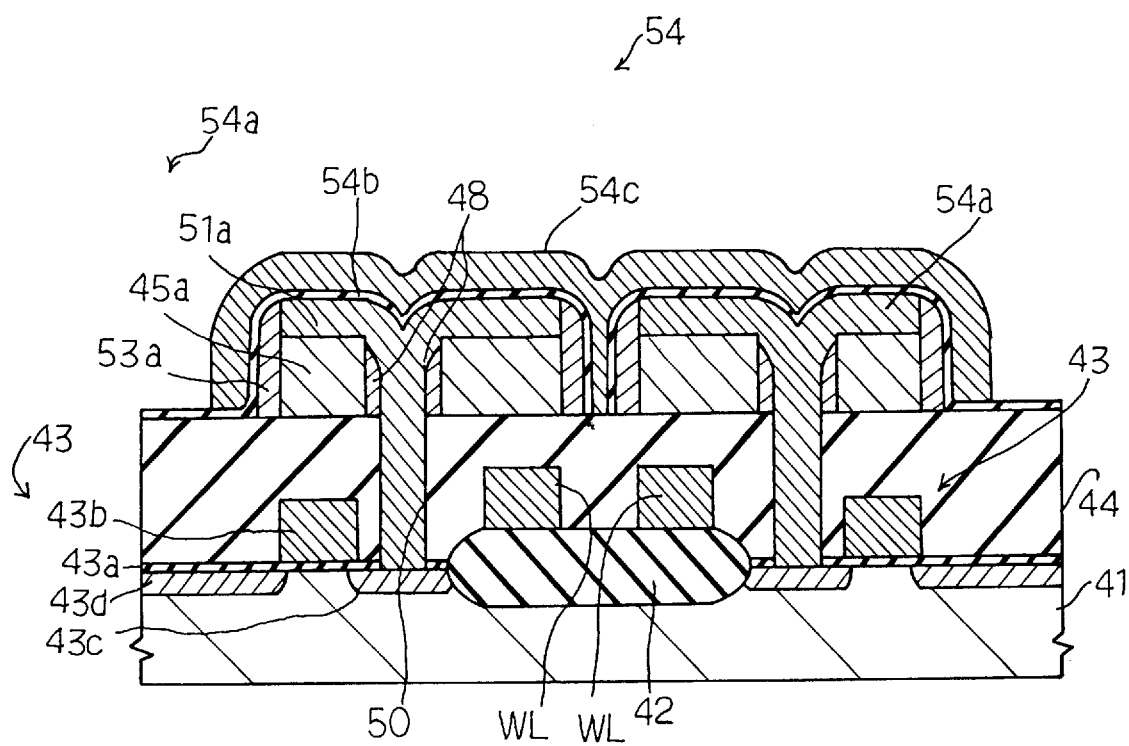
Figure 4A:
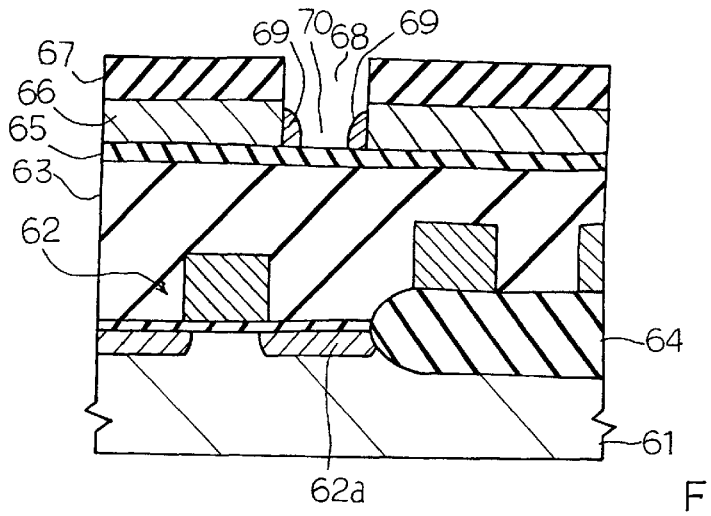
FIGS. 4A to 4H are cross sectional views showing the process sequence for fabricating a dynamic random access memory cell with a cylindrical storage node obtained during the development efforts.
Figure 4B:
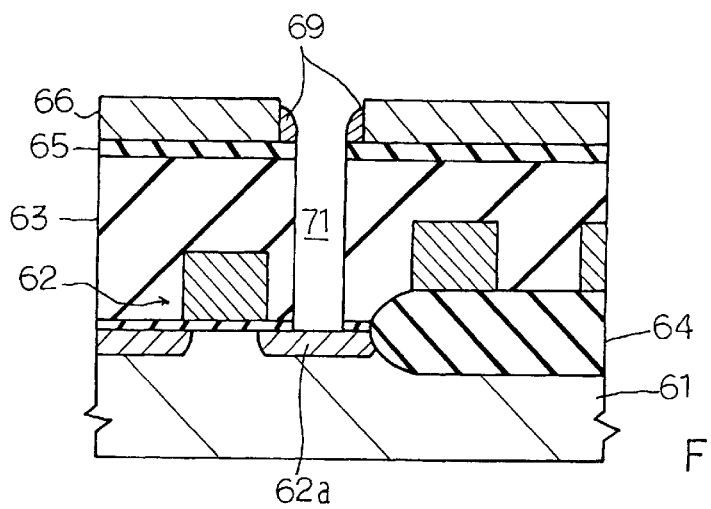
Figure 4C:
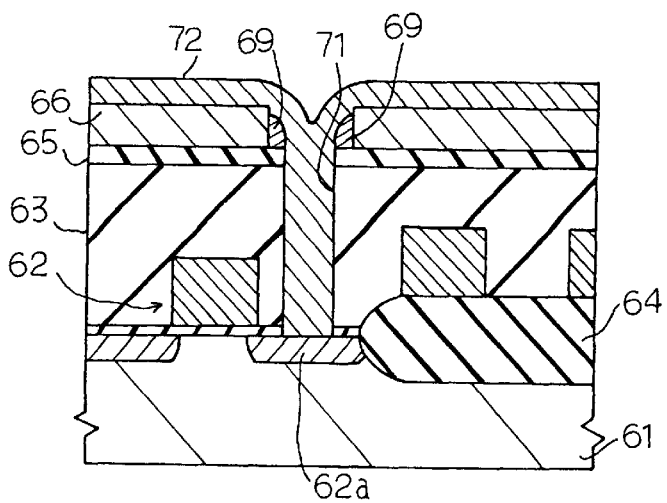
Figure 4D:
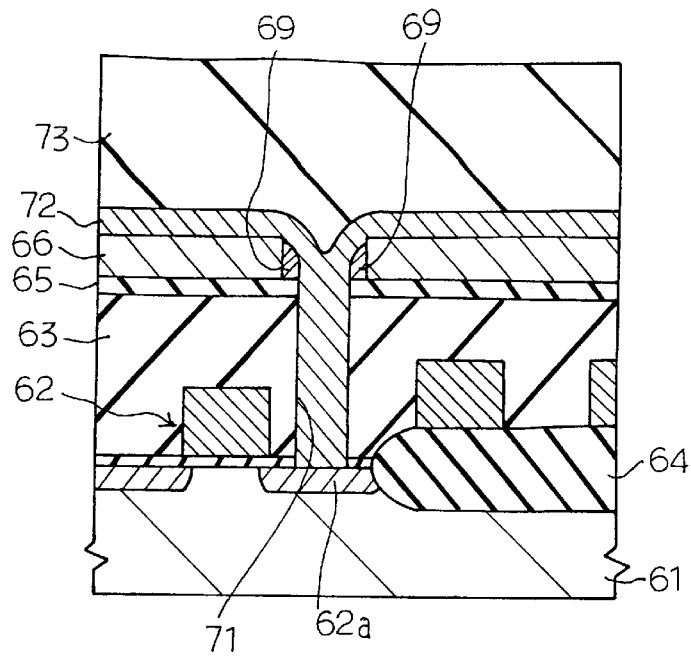
Figure 4E:
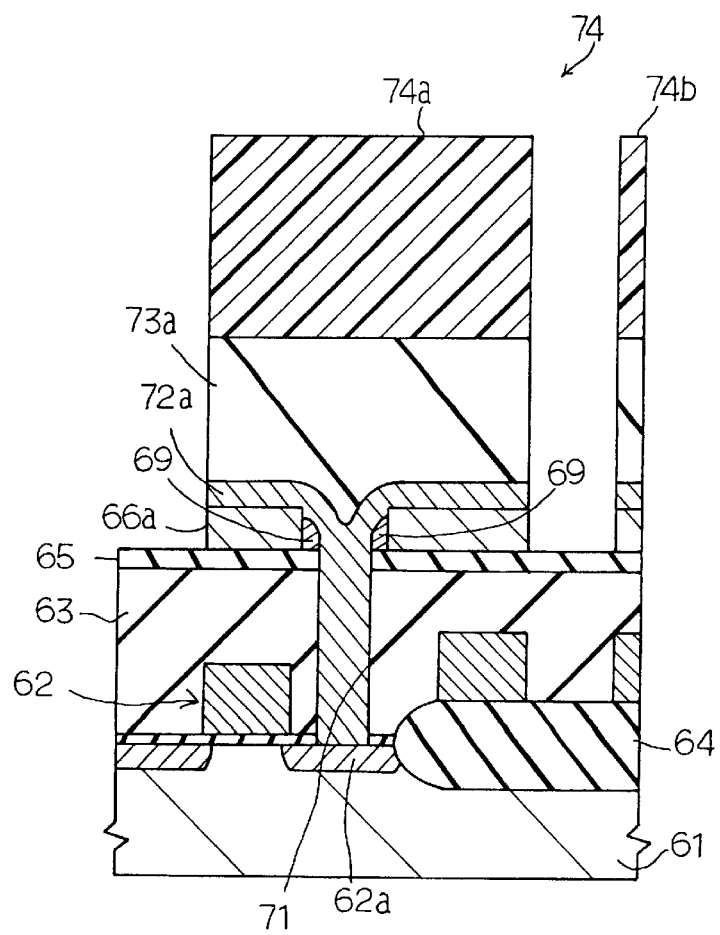
Figure 4F:
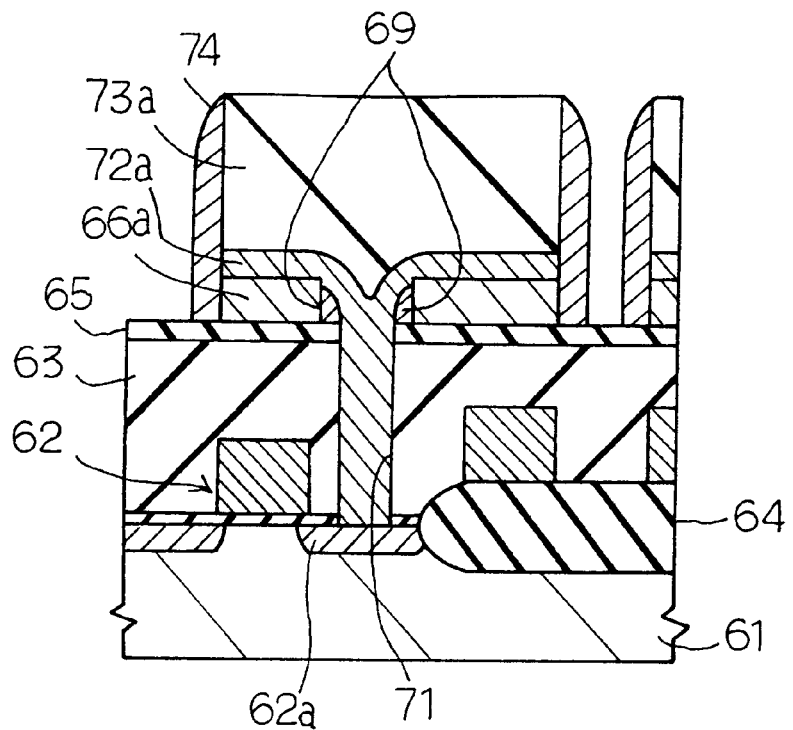
Figure 4G:
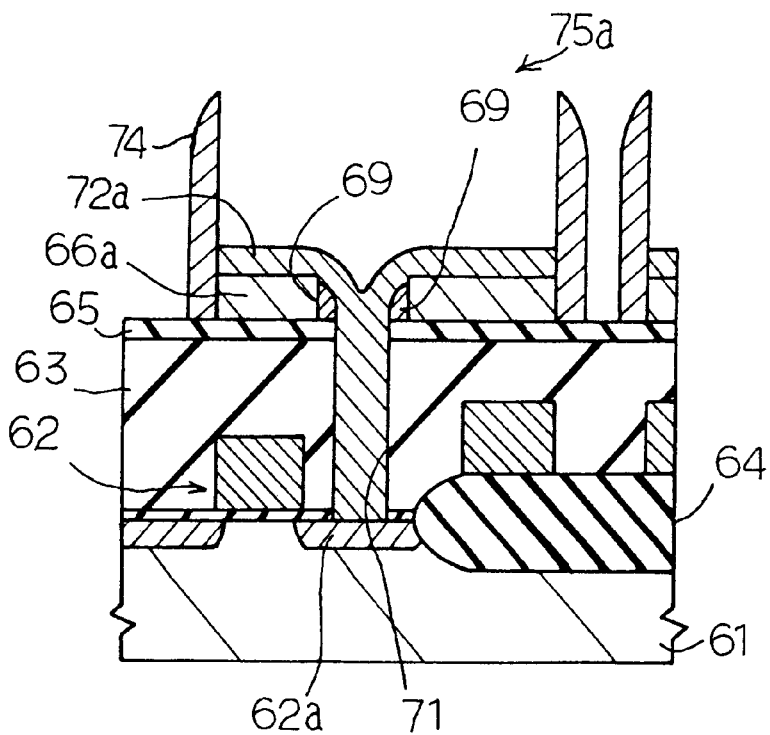
Figure 4H:
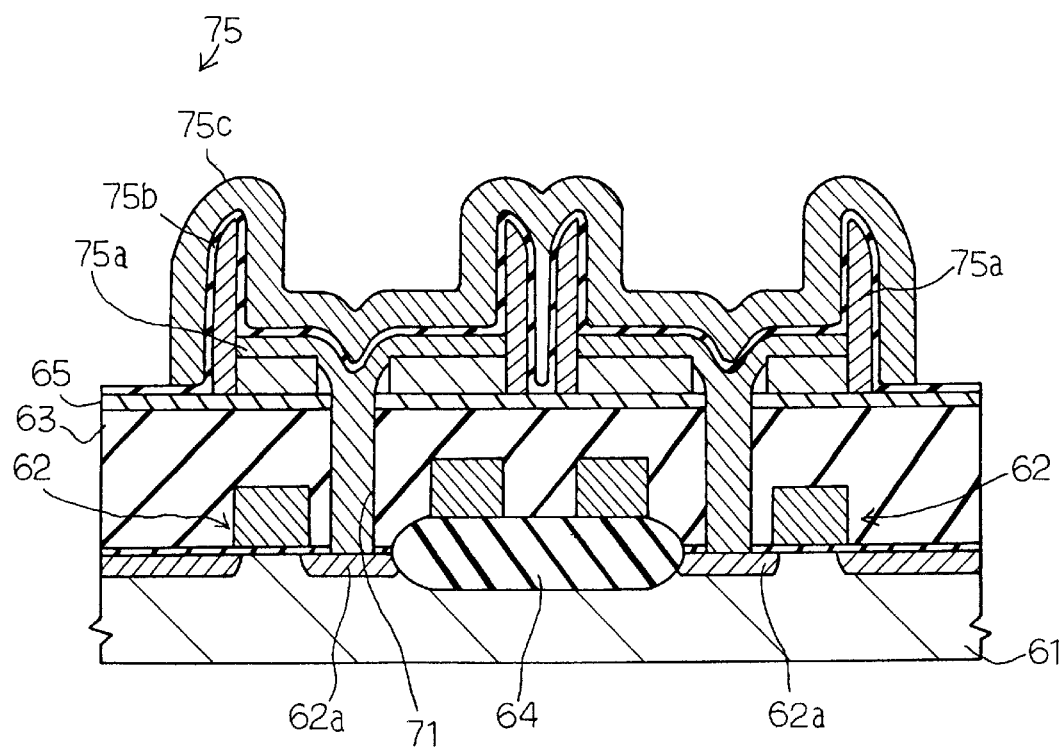

FIGS. 5A to 5G illustrate a process sequence embodying the present invention. A manufacturer is assumed to design a dynamic random access memory cell under the 0.4 micron design rules.

The process sequence starts with preparation of a p-type silicon substrate 81, and a field oxide layer 82 is selectively grown on the major surface of the p-type silicon substrate 81. The field oxide layer 82 defines an active area assigned to a pair of dynamic random access memory cells; however, description is focused on one of the dynamic random access memory cells.

The active area is thermally oxidized for growing a gate oxide layer 83a, and the gate oxide layer 83a is of the order of 10 nanometers thick. A gate electrode 83b is formed on the gate oxide layer 83a, and the gate electrode 83b is 0.4 micron in width. In this instance, the gate electrode 83b has a polyside structure or a laminated structure of polysilicon strip and a refractory metal silicide strip. The gate electrode 83b forms a part of a word line, and other word lines WL extend over the field oxide layer 82.

N-type dopant impurity is ion implanted into the active area, and an n-type source region 83c and an n-type drain region 83d are formed in the active area in a self-aligned manner with the gate electrode 83b. The n-type source region 83c is as narrow as 0.4 micron. The n-type drain region 83d is shared between the two dynamic random access memory cells assigned the active area, and is 0.6 micron in width. The gate oxide layer 83a, the gate electrode 83b, the n-type source region 83c and the n-type drain region 83d as a whole constitute an n-channel enhancement type witching transistor 83.

Silicon oxide is deposited to 0.2 micron thick over the n-channel enhancement type switching transistor 83 by using a low-pressure chemical vapor deposition, and a boro-phosphosilicate glass layer of 0.8 micron thick is laminated on the silicon oxide layer. The silicon oxide layer and the boro-phosphosilicate glass layer form in combination an inter-level insulating layer 84 of 1 micron thick.

Non-doped polysilicon is deposited to 0.5 micron thick over the inter-level insulating layer 84 by using a low-pressure chemical vapor deposition, and the inter-level insulating layer 84 is overlain by a non-doped polysilicon layer. N-type dopant impurity is thermally diffused from phosphorous oxytrichloride ($POCl_3$) into the non-doped polysilicon layer, and the non-doped polysilicon layer is converted to an n-type polysilicon layer 85.

Figure 5A:
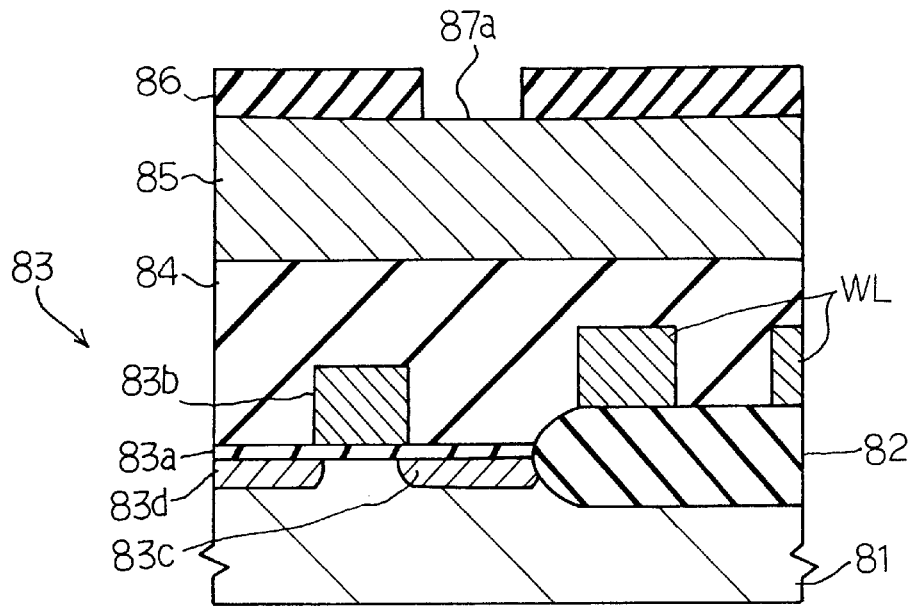
FIGS. 5A to 5G are cross sectional views showing a process sequence for fabricating a dynamic random access memory cell according to the present invention.

Silicon oxide is deposited to 0.15 micron thick over the n-type polysilicon layer 85 by using an atmospheric-pressure chemical vapor deposition, and a photo-resist etching mask (not shown) is patterned on the silicon oxide layer 86 so as to expose an area of the silicon oxide layer 86 over the n-type source region 83c. The exposed portion of the silicon oxide layer 86 is anisotropically etched away in gaseous mixture of tetrafluoromethane ($CF_4$) and trifluoromethane ($CHF_3$), and the anisotropic etching forms a primary opening 87a of 0.4 micron square in the silicon oxide layer 86 as shown in FIG. 5A.

The photo-resist etching mask is stripped off. Using the patterned silicon oxide layer 86 as an etching mask, the n-type doped polysilicon layer 85 is anisotropically etched in gaseous mixture of chlorine ($Cl_2$) and hydrogen bromide (HBr), and the primary opening 87a penetrates through the silicon oxide layer 86 and the n-type doped polysilicon layer 85. A part of the inter-level insulating layer 84 is exposed to the primary opening 87a.

Subsequently, n-type doped polysilicon is produced from gaseous mixture of $SiH_4$ and $PH_3$ by using a low-pressure chemical vapor deposition at 520 degrees in centigrade under 270 Pa, and is deposited to 0.15 micron thick on the entire surface of the resultant structure at 2.5 nanometers/minute. The n-type doped polysilicon layer extends on the upper and inner surfaces of the silicon oxide layer 86, the inner surface of the n-type doped polysilicon layer 85 and the part of the inter-level insulating layer 84.

Figure 5B:
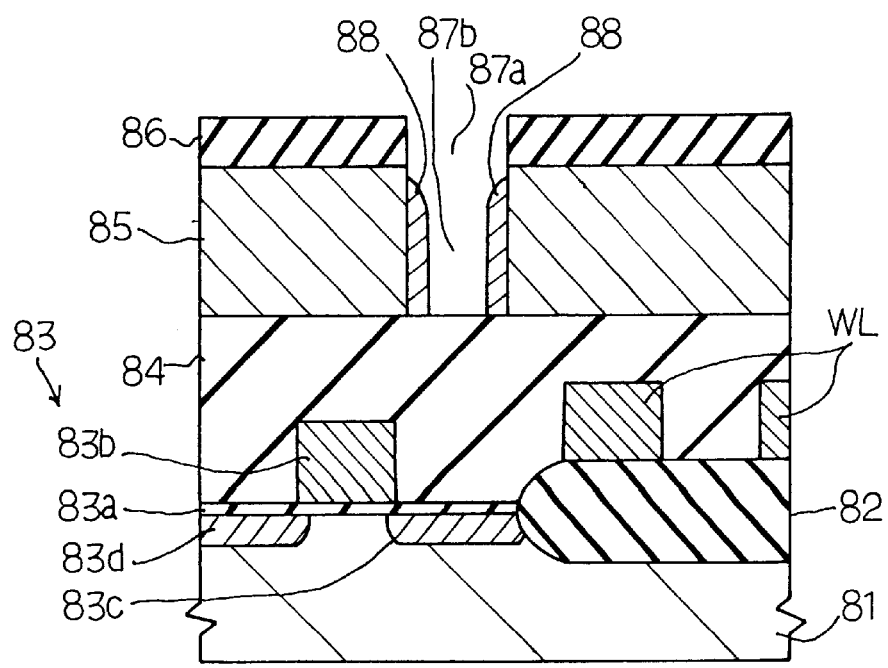

The n-type doped polysilicon layer is etched without a mask, and an inner side wall 88 is formed on the inner surface of the n-type doped polysilicon layer 85. The inner side wall 88 defines a secondary opening 87b narrower than the primary opening 87a as shown in FIG. 5B. The reason why the n-type doped polysilicon is deposited for forming the inner side wall 88 is that the n-type doped polysilicon is slower in growing speed than non-doped polysilicon. The manufacturer exactly controls the thickness of the slowly growing n-type doped polysilicon layer. Moreover, the n-type doped polysilicon forms a good step coverage.

Figure 5C:
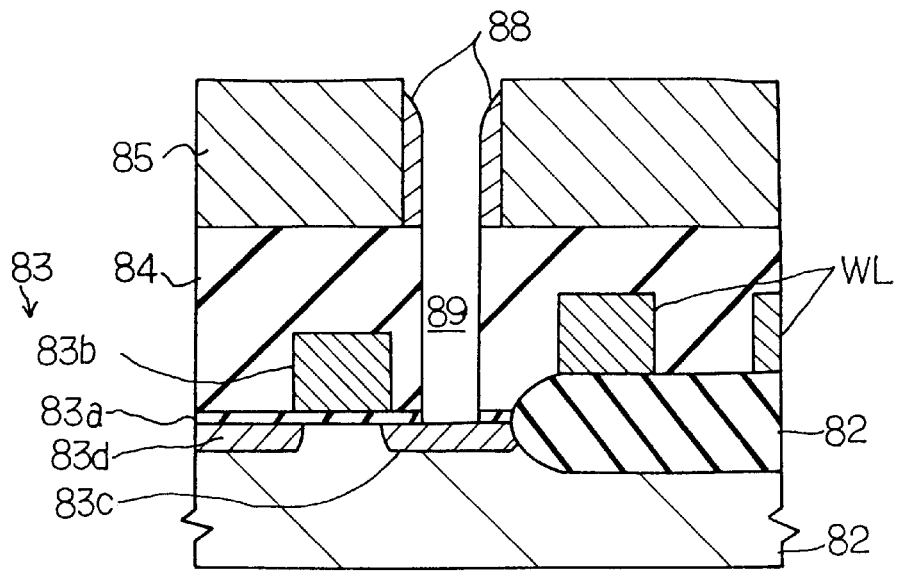

Using the n-type doped polysilicon layer 85 and the inner side wall 88 as an etching mask, the inter-level insulating layer 84 is anisotropically etched so as to form a miniature node contact hole 89 of 0.25 micron square. While the inter-level insulating layer 84 is being etched, the silicon oxide layer 86 is removed from the upper surface of the n-type doped polysilicon layer 85 as shown in FIG. 5C.

The surface of the resultant structure is treated with hexamethyldisilazane expressed as $(CH_3)_3SiNHSi(CH_3)_3$, and the exposed surfaces of the n-type doped polysilicon layer 85 and the surface of the inner side wall 88 become hydrophilic or wettable.

The upper surface of the n-type doped polysilicon layer 85 is coated with photo-resist layer solution. The wettable surface guides the photo-resist solution, and the photo-resist solution smoothly penetrates into the miniature node contact hole 89. The wettable surface further eliminates the problem from a baking step. The photo-resist layer is patterned into a photo-resist etching mask 90, and the photo-resist etching mask 90 covers an area over the n-type source region 83c. The photo-resist etching mask 90 has mask portions 90a and 90b spaced from each other by 0.4 micron.

Figure 5D:
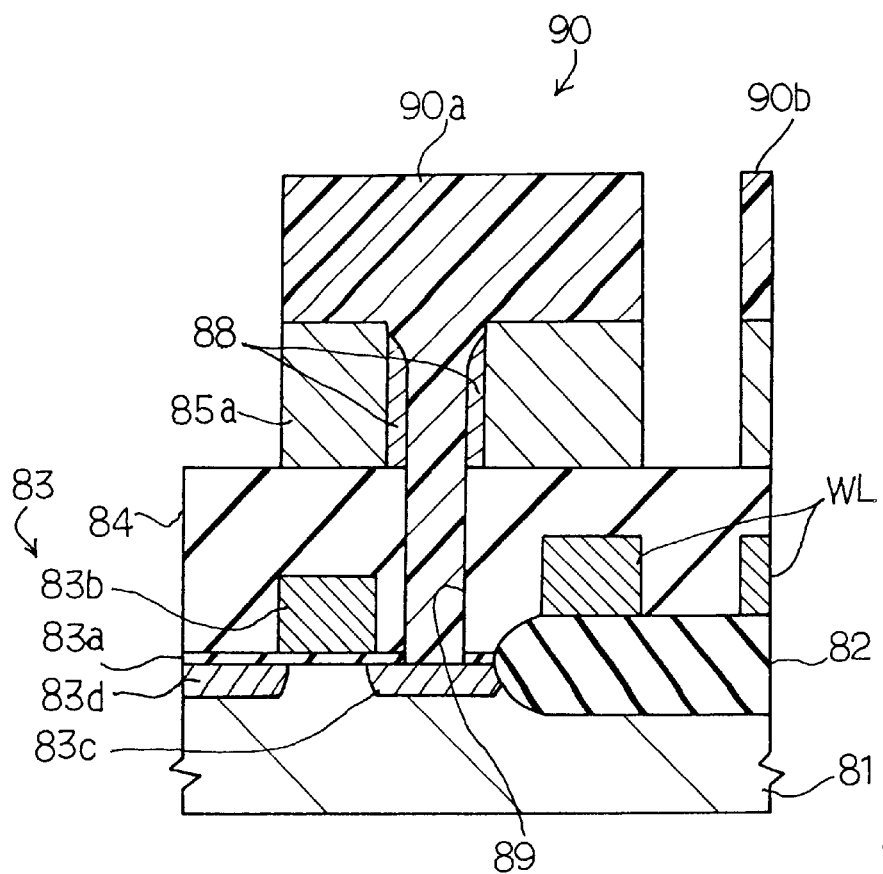

Using the photo-resist etching mask 90, the n-type doped polysilicon layer 85 is anisotropically etched so as to form an n-type doped polysilicon strip 85a on the inter-level insulating layer 84 as shown in FIG. 5D.

The photo-resist etching mask 90 is removed by using an oxygen plasma ashing. Even if the miniature node contact hole 89 has a high aspect ratio, no residual photo-resist is left in the miniature contact hole 89.

Figure 5E:
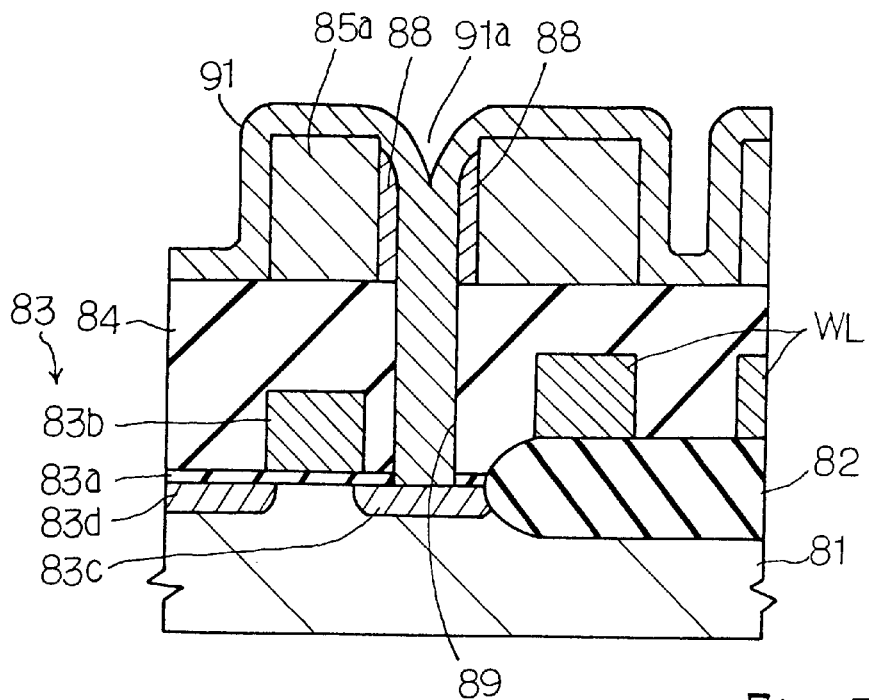

N-type doped polysilicon is deposited to 0.15 micron thick over the entire surface of the resultant structure. An n-type doped polysilicon layer 91 topographically extends on the inter-level insulating layer 84 and the side and upper surfaces of the n-type doped polysilicon strip 85a, and fills the miniature node contact hole 89. However, the upper surface of the n-type doped polysilicon layer 91 over the node contact hole 89 is not coplanar with the upper surface of the n-type doped polysilicon layer 91 over the n-type doped polysilicon strip 85a, and a recess 91a takes place. The n-type doped polysilicon forms a good step coverage, and the n-type doped polysilicon eliminates an introduction of n-type dopant impurity into a non-doped polysilicon in the miniature node contact hole 89 from the process. The resultant structure is illustrated in FIG. 5E.

It is not preferable to increase the thickness of the n-type doped polysilicon layer 91. When the thickness is 0.15 micron, the recess takes place over the miniature node contact hole 89. However, if the thickness is increased to 0.2 micron, the n-type doped polysilicon forms a flat upper surface over the n-type doped polysilicon strip 85a and the miniature node contact hole 89 without a recess 91a. Thus, the thickness of the n-type doped polysilicon layer 85 is less than 80 percent of the width of the node contact hole 89.

Figure 5F:
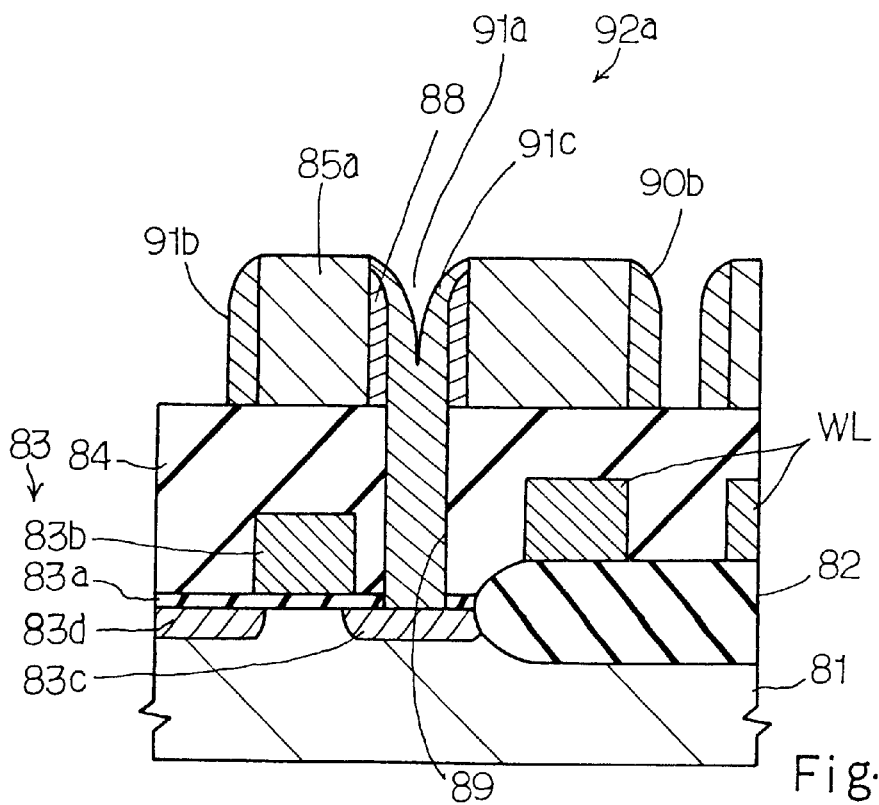

Subsequently, the n-type doped polysilicon layer 91 is etched without a mask, and an outer side wall 91b and a plug 91c are concurrently formed from the n-type doped polysilicon layer 91 as shown in FIG. 5F. The inner side wall 88, the n-type doped polysilicon strip 85a, the outer side wall 91b and the plug 91c as a whole constitute a storage node electrode 92a, and the outer side wall 91b increases the surface area of the storage node electrode 92a. The outer side wall 91b increases the surface area of the storage node electrode 92a is approximately equal to the surface area of the storage node electrode 54a, and the recess 91a further increases the surface area of the storage node electrode 92a over the storage node electrode 54a. The storage node electrode 92a is spaced from the adjacent storage node electrode by 0.25 micron less than the minimum design rule of 0.4 micron.

Figure 5G:
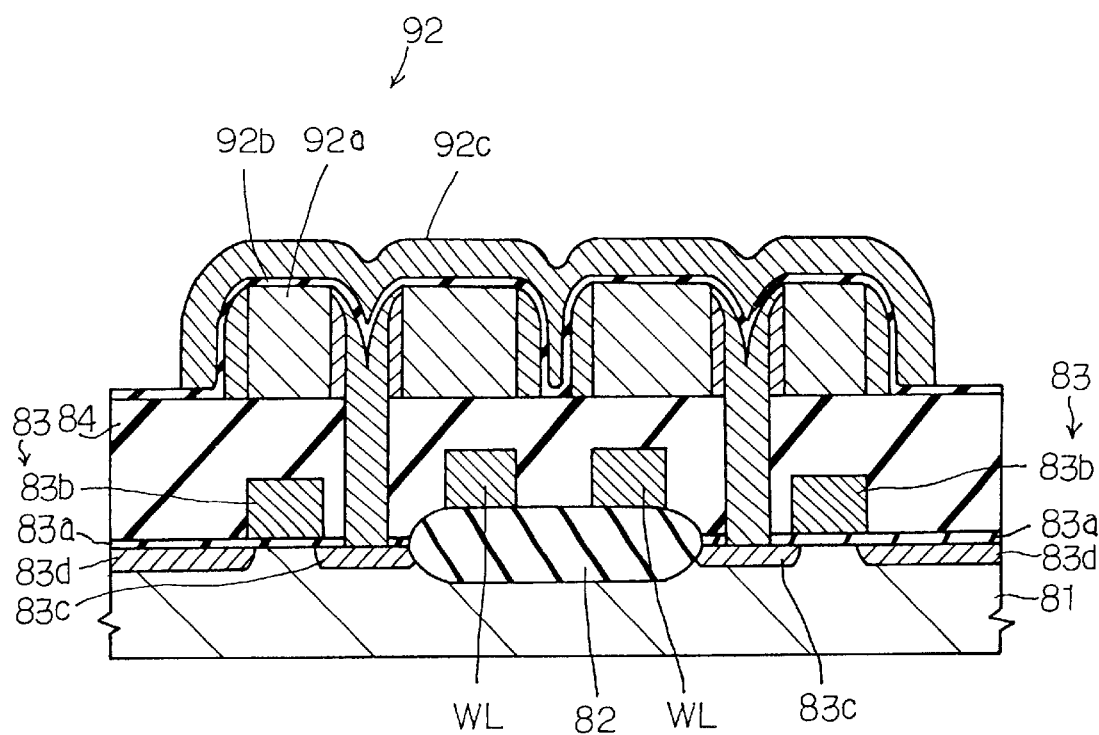

Silicon nitride is deposited to 6 nanometers thick by using a low-pressure chemical vapor deposition, and the silicon nitride layer serves as a dielectric film 92b. A conductive layer is formed over the dielectric film 92b, and is patterned into a counter electrode 92c. The storage node electrode 92a, the dielectric film 92b and the counter electrode 92c as a whole constitute a stacked storage capacitor 92, and the n-channel enhancement type switching transistor 83 and the stacked storage capacitor 92 form in combination the dynamic random access memory cell as shown in FIG. 5G.

In the above described embodiment, bit lines are not described. The bit lines may be formed over or under the storage capacitor 92.

In the first embodiment, the p-type silicon substrate 81, the n-type doped polysilicon layer 85, the n-type doped polysilicon layer 91 and the inter-level insulating layer 84 serves as a first semiconductor layer, a second semiconductor layer, a third semiconductor layer and an inter-level insulating structure, and the n-type doped polysilicon layer 85 and the silicon oxide layer 86 as a whole constitute a multi-level structure.

As will be appreciated from the foregoing description, the outer side wall 91b and the plug 91c are concurrently formed from the n-type doped polysilicon layer 91, and the growth of the n-type doped polysilicon is carried out only twice. Thus, the process according to the present invention is simpler than the combined process.

When the thickness of the n-type doped polysilicon layer 91 is appropriately controlled, the recess 91a takes place, and the recess 91a increases the surface area of the storage node electrode 92a.

Second Embodiment

FIGS. 6A to 6H are cross sectional views showing another process embodying the present invention. A dynamic random access memory device is also assumed to be designed under 0.4 micron design rules.

The process sequence starts with preparation of a p-type silicon substrate 101, and a field oxide layer 102 is selectively grown on the major surface of the p-type silicon substrate 101. The field oxide layer 102 defines an active area assigned to a pair of dynamic random access memory cells; however, description is focused on one of the dynamic random access memory cells as similar to the first embodiment.

The active area is thermally oxidized for growing a gate oxide layer 103a, and a gate electrode 103b is formed on the gate oxide layer 103a. The gate electrode 103b has the same dimensions and the same structure as the gate electrode 83b. The gate electrode 103b forms a part of a word line, and other word lines WL extend over the field oxide layer 102.

N-type dopant impurity is ion implanted into the active area, and an n-type source region 103c and an n-type drain region 103d are formed in the active area in a self-aligned manner with the gate electrode 103b. The gate oxide layer 103a, the gate electrode 103b, the n-type source region 103c and the n-type drain region 103d as a whole constitute an n-channel enhancement type witching transistor 103. Thus, the n-channel enhancement type switching transistor 103 is fabricated on the p-type silicon substrate 101 as similar to the first embodiment.

An inter-level insulating layer 104 covers the n-channel enhancement type switching transistor 103 and the field oxide layer 102, and the inter-level insulating layer 104 is 1 micron thick. The inter-level insulating layer 104 is formed of the same materials as the inter-level insulating layer 84.

Subsequently, silicon nitride is deposited to 0.2 micron thick by using the low-pressure chemical vapor deposition over the entire surface of the resultant structure, and the upper surface of the inter-level insulating layer 104 is covered with a silicon nitride layer 105.

Non-doped polysilicon is deposited to 0.2 micron thick over the silicon nitride layer 105 by using the low-pressure chemical vapor deposition, and the silicon nitride layer 105 is overlain by a non-doped polysilicon layer. N-type dopant impurity is introduced into the non-doped polysilicon layer, and covers the non-doped polysilicon layer to an n-type doped polysilicon layer 106.

Subsequently, phosphosilicate glass is deposited to 0.8 micron thick over the n-type doped polysilicon layer 106 by using an atmospheric-pressure chemical vapor deposition, and the n-type doped polysilicon layer 106 is overlain by a phosphosilicate glass layer 107.

Non-doped amorphous silicon is deposited to 0.2 micron thick over the phosphosilicate glass layer 107 by using the low-pressure chemical vapor deposition, and the phosphosilicate glass layer 107 is overlain by a non-doped amorphous silicon layer 108. As will be described hereinlater, the non-doped amorphous silicon layer 108 is perfectly removed, and it is desirable not to crystallize the amorphous silicon.

Silicon oxide is deposited to 0.2 micron thick over the non-doped polysilicon layer 108 by using a plasma-exited chemical vapor deposition, and the non-doped polysilicon layer 108 is overlain by a silicon oxide layer 109. The plasma-exited chemical vapor deposition system grows the silicon oxide at a low temperature, and prevents the amorphous silicon layer 108 from crystallization.

Figure 6A:
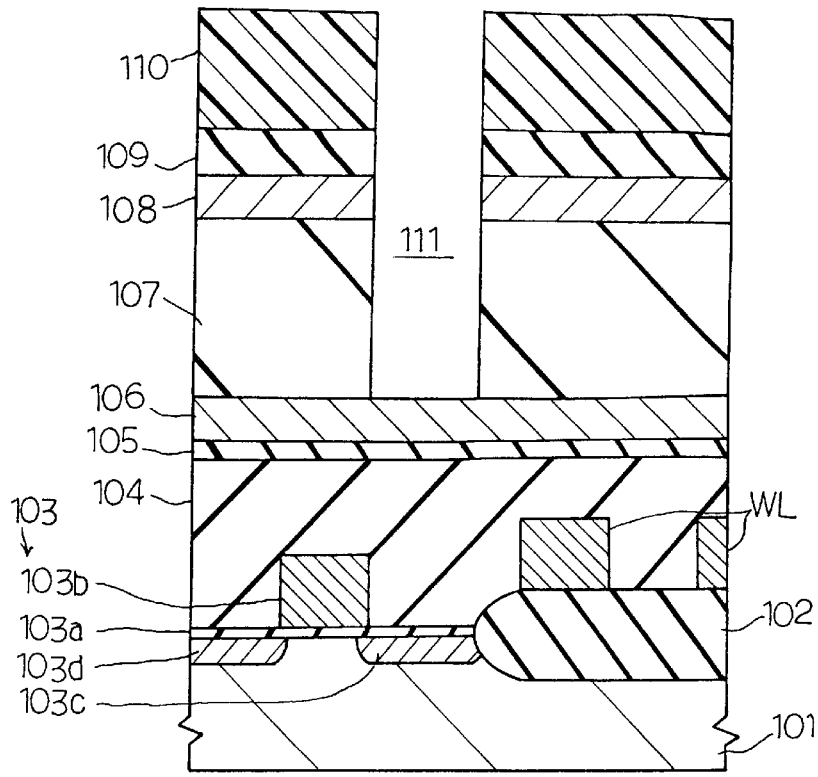
FIGS. 6A to 6H are cross sectional views showing another process sequence for fabricating a dynamic random access memory cell according to the present invention.

A photo-resist etching mask 110 is formed on the silicon oxide layer 109 by using lithographic techniques, and exposes an area of the silicon oxide layer 109 over the n-type source region 103c. The silicon oxide layer 109, the non-doped polysilicon layer 108 and the phosphosilicate glass layer 107 are anisotropically etched by using the photo-resist etching mask 110, and a primary opening 111 is formed in the lamination of the phosphosilicate glass layer 107, the non-doped polysilicon layer 108 and the silicon oxide layer 109 as shown in FIG. 6A. The primary opening 111 is 0.4 micron square, and reaches the upper surface of the n-type doped polysilicon layer 106.

Figure 6B:
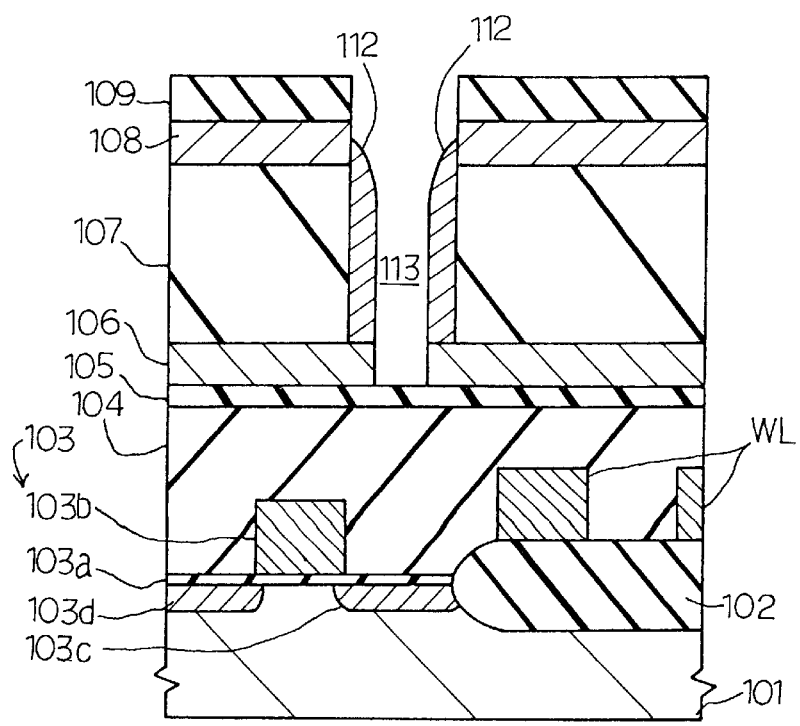

The photo-resist etching mask 110 is stripped off, and n-type doped polysilicon is deposited to 0.15 micron thick over the entire surface of the resultant structure, and an n-type doped polysilicon layer topographically extends on the upper and inner surfaces of the silicon oxide layer 109, the inner surface of the amorphous silicon layer 108, the inner surface of the phosphosilicate glass layer 107, the inner surface of the n-type doped polysilicon layer 106 and a part of the upper surface of the silicon nitride layer 105. The n-type doped polysilicon layer is etched without a mask, and an inner side wall 112 is formed on the inner surface of the phosphosilicate glass layer 112. The inner side wall 112 defines a secondary opening 113 narrower than the primary opening as shown in FIG. 6B.

Figure 6C:
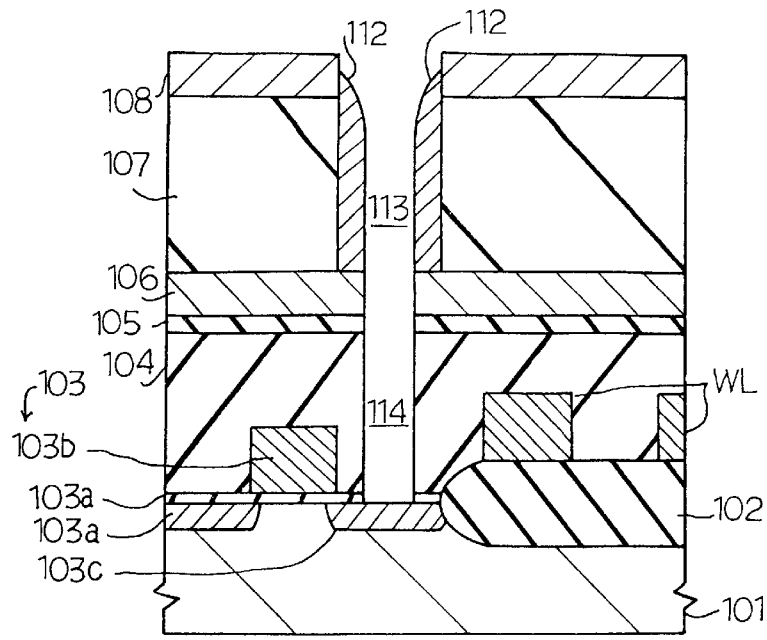

Subsequently, the silicon nitride layer 105 and the inter-level insulating layer 104 are anisotropically etched in gaseous mixture of $CF_4$ and $CHF_3$ by using the amorphous silicon layer 108 and the inner side wall 112 as an etching mask. A node contact hole 114 is formed in the lamination of the silicon nitride layer 105 and the inter-level insulating layer 104 as shown in FIG. 6C, and is 0.25 micron square. The silicon oxide layer 109 is removed during the anisotropic etching.

The resultant structure is treated with hexamethyldisilazane expressed as $(CH_3)_3SiNHSi(CH_3)_3$, and makes the surfaces exposed to the secondary opening 113 and the node contact hole 114 hydrophilic or wettable.

A photo-resist etching mask 115 is formed on the amorphous silicon layer 108, and the wettable surfaces allows the photo-resist solution to fill the miniature node contact hole 114 as similar to the first embodiment. The photo-resist etching mask 115 has mask portions spaced from one another by 0.4 micron.

Figure 6D:
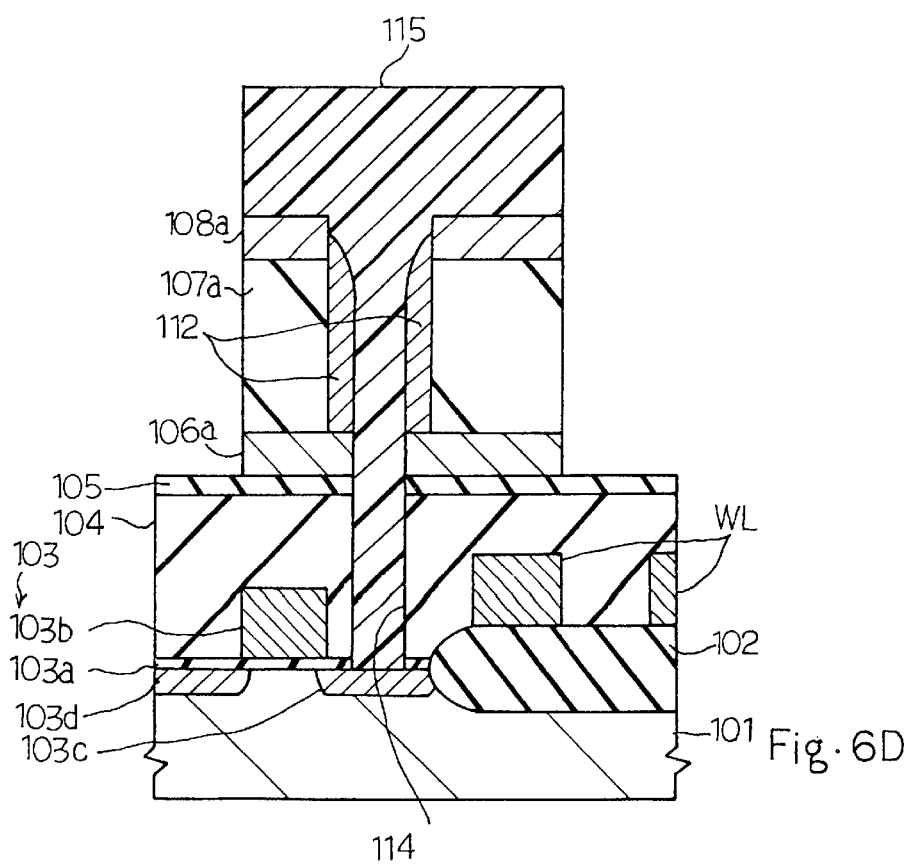

Using the photo-resist etching mask 115, the amorphous silicon layer 108a, the phosphosilicate glass layer 107 and the n-type doped polysilicon layer 106 are anisotropically etched, and an amorphous silicon strip 108a, a phosphosilicate glass strip 107a and an n-type doped polysilicon strip 106a are left beneath the photo-resist etching mask 115 as shown in FIG. 6D.

The photo-resist etching mask 115 is removed from the resultant structure by using an oxygen plasma ashing technique, and no residual photo-resist is left in the miniature node contact hole 114.

Figure 6E:
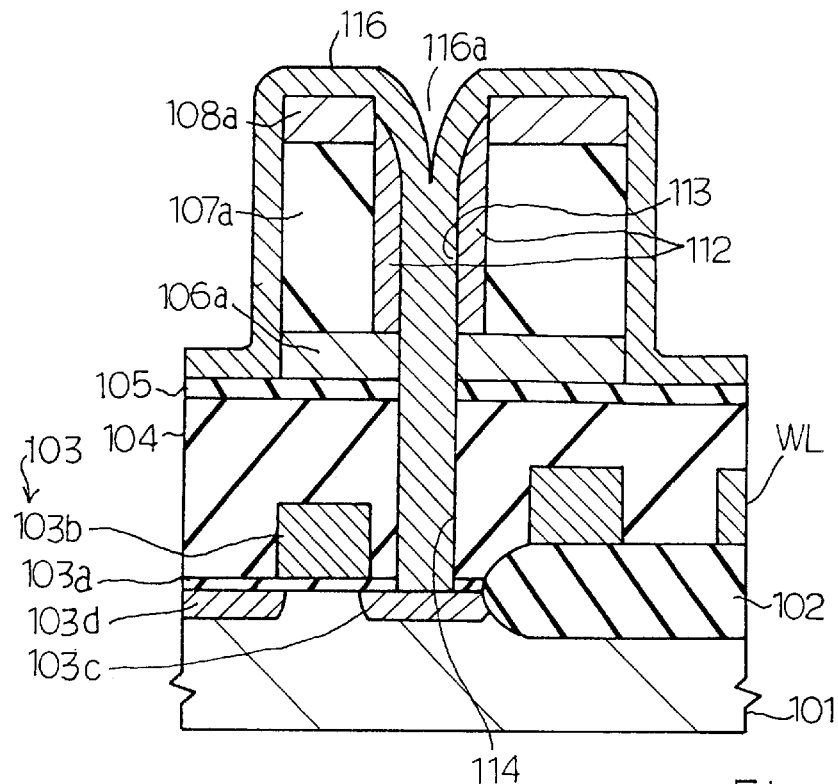

Subsequently, n-type doped polysilicon is deposited to 0.15 micron over the entire surface of the structure by using the same deposition technique as the n-type doped polysilicon layer 106, and an n-type doped polysilicon layer 116 topographically extends on the exposed silicon nitride layer 105, the outer side surfaces of the strips 106a/107a/108a, the upper surface of the amorphous silicon strip 108a and the inner surfaces exposed to the secondary opening 113 and the miniature node contact hole 114, because the n-type polysilicon forms a good step coverage. A recess 116a takes place in the upper surface over the miniature node contact hole 114. The resultant structure is illustrated in FIG. 6E.

Figure 6F:
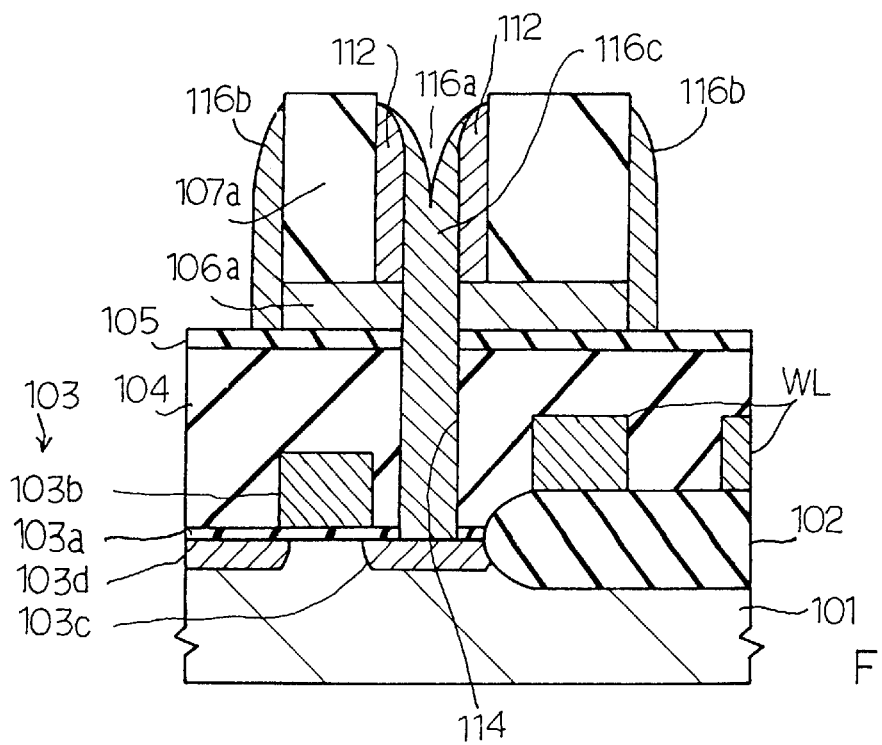

The n-type doped polysilicon layer 116 and the amorphous silicon strip 108a are etched without a mask, and an outer side wall 116b and a plug 116 are concurrently formed from the n-type doped polysilicon layer 116. As shown in FIG. 6F. The amorphous silicon strip is perfectly etched away, and no residue is left on the phosphosilicate glass strip 107a.

Figure 6G:
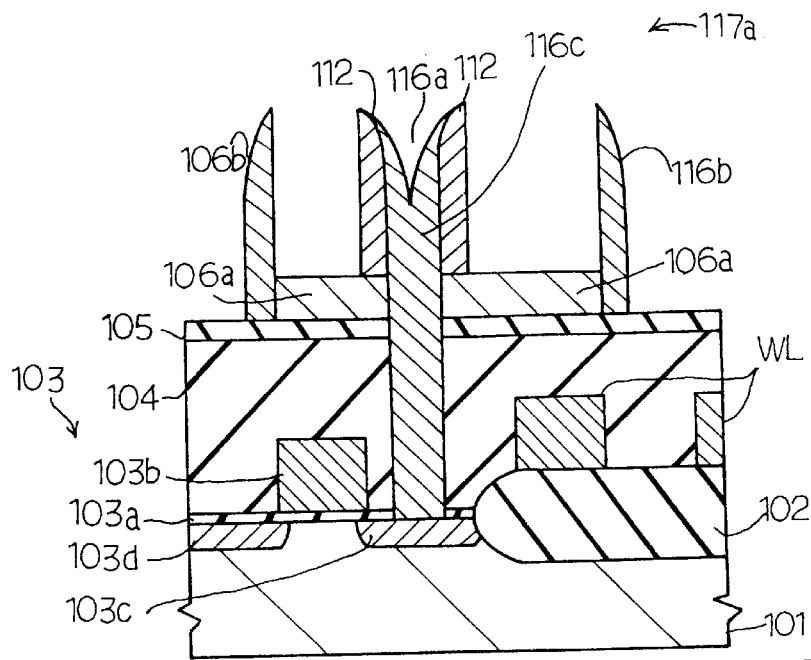

Subsequently, the phosphosilicate glass strip 107a is exposed to gaseous mixture of hydrogen fluoride (HF) and water vapor, and is removed from the structure as shown in FIG. 6G. The inner side wall 112, the n-type doped polysilicon strip 106a, the cylindrical outer side wall 116b and the plug 16c as a whole constitute a cylindrical storage node electrode 117a, and the cylindrical outer side wall 116b increases the surface area of the storage node electrode 117a rather than the storage node electrode 92a. The cylindrical storage node electrode 117a is spaced from the adjacent cylindrical storage node electrode by 0.25 micron.

Although dilute hydrofluoric acid or buffered hydrofluoric acid can remove the phosphosilicate glass strip 107a, the gas etching is desirable, because the rinse after the wet etching is less desirable for the cylindrical outer wide wall 116b.

Figure 6H:
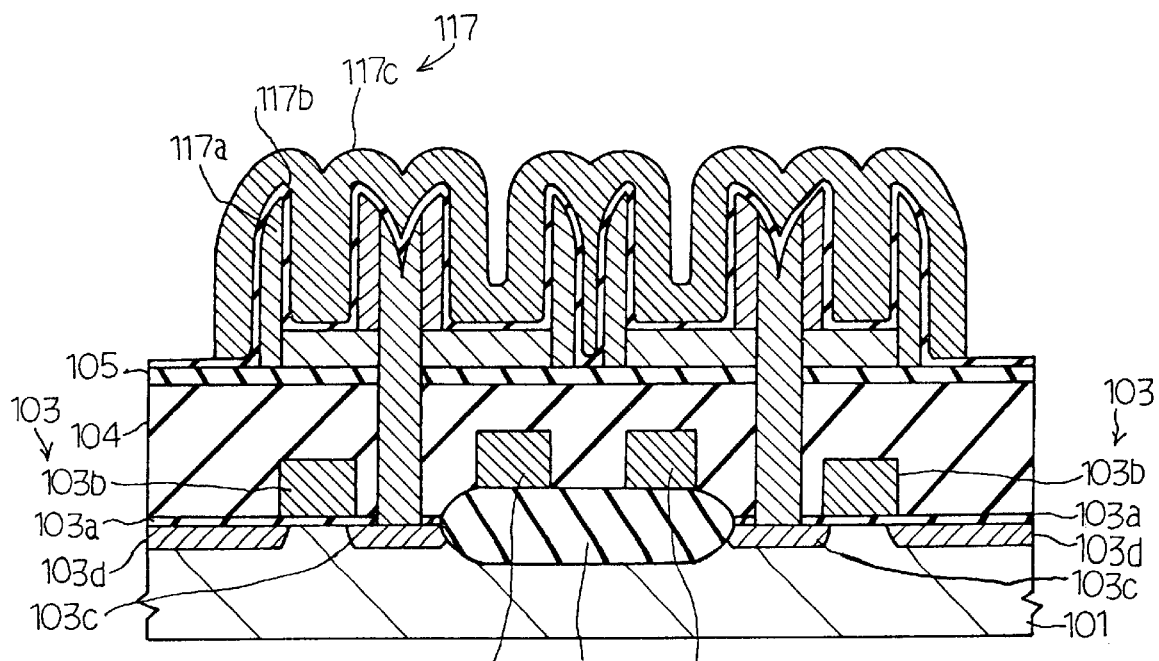

Silicon nitride is deposited to 6 nanometers thick over the entire surface of the resultant structure by using the low-pressure chemical vapor deposition, and a dielectric film 117b of the silicon nitride covers the cylindrical storage node electrodes 117a. A conductive material is deposited over the dielectric film 117b, and a conductive layer is patterned into a cell-plate or counter electrode 117c by using the lithographic techniques as shown in FIG. 6H.

The cylindrical storage node electrode 117a, the dielectric film 117b and the counter electrode 117c as a whole constitute a storage capacitor 117, and the storage capacitor 117 and the n-channel enhancement type switching transistor 103 form in combination the dynamic random access memory cell.

In this instance, the p-type silicon substrate 101, the n-type doped polysilicon 106 and the n-type doped polysilicon layer 116 serve as a first semiconductor layer, a second semiconductor layer and a third semiconductor layer, respectively. The inter-level insulating layer 104 and the silicon nitride layer 105 form in combination an inter-level insulating structure, and the n-type doped polysilicon layer 106, the phosphosilicate glass layer 107, the amorphous silicon layer 108 and the silicon oxide layer 109 as a whole constitute a multi-level structure.

The process implementing the second embodiment achieves all the advantages of the first embodiment, and the outer cylindrical side wall further increases the surface of the storage node electrode 117a.

Although particular embodiments of the present invention have been shown and described, it will be obvious to those skilled in the art that various changes and modifications may be made without departing from the spirit and scope of the present invention.

For example, the dynamic random access memory cells may form parts of a memory cell array together with other function blocks.

The dielectric layer 92b and 117b may be of a composite film structure including a silicon nitride layer and a silicon oxide layer.

What is claimed is:

1. A process of fabricating a dynamic random access memory device, comprising the steps of:

a) preparing a first semiconductor layer;

b) fabricating a switching transistor having an impurity region on said first semiconductor layer;

c) covering said switching transistor and said first semiconductor layer with an inter-level insulating structure;

d) forming a multi-level structure including a second semiconductor layer on said inter-level insulating structure;

e) forming a primary opening in said multi-level structure over said impurity region;

f) forming an inner conductive side wall held in contact with said second semiconductor layer on an inner surface of said multi-level structure defining said primary opening, said inner conductive side wall defining a secondary opening narrower than said primary opening;

g) selectively etching said inter-level insulating structure so as to form a node contact hole beneath said secondary opening, said impurity region being exposed to said node contact hole;

h) forming a first etching mask having a lug portion filling said node contact hole on said multi-level structure;

i) selectively etching said multi-level structure so as to form a patterned structure including a semiconductor strip formed from said second semiconductor layer;

j) removing said first etching mask so as to expose said impurity region again;

k) topographically depositing a third semiconductor layer on the entire surface of the resultant structure of said step j) so as to fill said node contact hole and cover said inner conductive side wall and an upper surface and an outer side surface of said patterned structure;

l) uniformly etching said third semiconductor layer so as to form an outer conductive side wall held in contact with an outer side surface of said semiconductor strip and a conductive plug held in contact with said inner conductive side wall and said impurity region, said outer conductive side wall, said semiconductor strip, said inner conductive side wall and said conductive plug forming in combination a storage node electrode electrically connected to said witching transistor;

m) covering said storage node electrode with a dielectric layer; and n) forming a counter electrode opposed through said dielectric layer to said storage node electrode.

2. The process as set forth in claim 1, in which said step b) includes sub-steps of:

b-1) growing a gate insulating layer on said first semiconductor layer;

b-2) forming a gate electrode on said gate insulating layer; and b-3) introducing a dopant impurity of one conductivity type opposite to the other conductivity type of said first semiconductor layer into said first semiconductor layer in a self-aligned manner with said gate electrode.

3. The process as set forth in claim 1, in which said steps d) to g) include the sub-steps of:

d-1) depositing an intentionally undoped silicon so as to form an intentionally undoped silicon layer on said inter-level insulating structure;

d-2) introducing a dopant impurity of one conductivity type into said intentionally undoped silicon layer so as to convert said intentionally undoped silicon layer to a first doped silicon layer serving as said second semiconductor layer;

d-3) depositing a silicon oxide so as to cover said first doped silicon layer with a silicon oxide layer; and e-1) forming a second etching mask on said silicon oxide layer for covering an upper surface of said silicon oxide layer except for an area over said impurity region;

e-2) selectively etching said silicon oxide layer so as to form said primary opening;

e-3) removing said second etching mask;

e-4) selectively etching said first doped silicon layer by using said silicon oxide layer as a third etching mask so as to penetrate said primary opening through said first doped silicon layer;

f-1) depositing a second doped silicon layer over an entire surface of the resultant structure of step e-4) so as to extend on an upper surface of said silicon oxide layer and inner surfaces defining said primary opening;

f-2) etching said second doped silicon layer without an etching mask so as to form said inner conductive side wall on the inner surface of said first doped silicon layer; and g-1) etching said inter-level insulating structure until said first doped silicon layer is exposed by using an etchant without a selectivity between an insulating substance of said inter-level insulating structure and said silicon oxide.

4. The process as set forth in claim 1, in which said steps h) to l) include the sub-steps of:

h-1) treating at least an upper surface of said first doped silicon layer, said inner conductive side wall and inner surfaces defining said node contact hole with a hydrophilic agent;

h-2) forming a photo-resist layer over an entire surface of the resultant structure of said step h-1) so as to fill said node contact hole and extend over said first doped silicon layer;

h-3) patterning said photo-resist layer into said first etching mask;

i-1) patterning said first doped silicon layer into said semiconductor strip;

j-1) exposing said first etching mask to an oxygen plasma so as to ash said first etching mask;

k-1) depositing a third doped silicon layer serving as said third semiconductor layer so as to fill said node contact hole and extend over said upper surface of said semiconductor strip and said outer side surface of said semiconductor strip; and l-1) etching said third doped silicon layer without an etching mask so as to concurrently form said outer conductive side wall and said conductive plug from said third doped silicon layer.

5. The process as set forth in claim 4, in which the thickness of said third doped silicon layer is less than 80 percent of a width of said node contact hole so as to form a recess in an upper surface of said conductive plug.

6. The process as set forth in claim 1, in which said steps c) to g) include the sub-steps of:

c-1) depositing an inter-level insulating layer of silicon oxide;

c-2) depositing a silicon nitride layer on said inter-level insulating layer so as to form said inter-level insulating structure;

d-1) depositing an intentionally undoped silicon so as to form an intentionally undoped silicon layer on said silicon nitride layer;

d-2) introducing a dopant impurity of one conductivity type into said intentionally undoped silicon layer so as to convert said intentionally undoped silicon layer to a first doped silicon layer serving as said second semiconductor layer;

d-3) depositing a phosphosilicate glass so as to cover said first doped silicon layer with a phosphosilicate glass layer;

d-4) depositing intentionally undoped amorphous silicon over said phosphosilicate glass layer so as to cover said phosphosilicate glass layer with an intentionally undoped amorphous silicon layer;

d-5) depositing silicon oxide over said intentionally undoped amorphous silicon layer at a temperature lower than a recrystallizing temperature of said intentionally undoped amorphous silicon so as to cover said intentionally undoped amorphous silicon layer with a silicon oxide layer;

e-1) forming a second etching mask on said silicon oxide layer for covering an upper surface of said silicon oxide layer except for an area over said impurity region;

e-2) selectively etching said silicon oxide layer, said intentionally undoped amorphous silicon layer and said phosphosilicate glass layer so as to form said primary opening;

e-3) removing said second etching mask;

f-1) depositing a second doped silicon layer over an entire surface of the resultant structure of step e-3) so as to extend on an upper surface of said silicon oxide layer and inner surfaces defining said primary opening;

f-2) etching said first doped silicon layer and said second doped silicon layer without an etching mask so as to form said inner conductive side wall on at least the inner surface of said phosphosilicate glass layer, said secondary opening penetrating through said first doped silicon layer; and g-1) selectively etching said silicon nitride layer and said inter-level insulating layer so as to form said node contact hole, said silicon oxide layer being removed during the etching of said inter-level insulating layer.

7. The process as set forth in claim 1, in which said steps h) to l) include the sub-steps of:

h-1) treating at least an upper surface of said intentionally undoped amorphous silicon layer, said inner conductive side wall and inner surfaces defining said node contact hole with a hydrophilic agent;

h-2) forming a photo-resist layer over an entire surface of the resultant structure of said step h-1) so as to fill said node contact hole and extend over said unintentionally undoped amorphous silicon layer;

h-3) patterning said photo-resist layer into said first etching mask;

i-1) patterning said intentionally undoped amorphous silicon layer, said phosphosilicate glass layer and said first doped silicon layer into said patterned structure including said semiconductor strip;

j-1) exposing said first etching mask to an oxygen plasma so as to ash said first etching mask;

k-1) depositing a third doped silicon layer serving as said third semiconductor layer so as to fill said node contact hole and extend over an upper surface and an outer side surface of said patterned structure;

l-1) etching said third doped silicon layer without an etching mask so as to concurrently form said outer conductive side wall and said conductive plug from said third doped silicon layer, said intentionally undoped amorphous silicon layer being removed during the formation of said outer conductive side wall and said conductive plug;

l-2) removing said phosphosilicate glass layer so that said inner conductive side wall and said outer conductive side wall upwardly projecting over the upper surface of said semiconductor strip.

8. The process as set forth in claim 6, in which said silicon oxide is deposited by using a plasma exited chemical vapor deposition in said sub-step d-5).

9. The process as set forth in claim 7, in which the thickness of said third doped silicon layer is less than 80 percent of a width of said node contact hole so as to form a recess in an upper surface of said conductive plug.

* * * * *